United States Patent
Cheung et al.

(10) Patent No.: US 6,562,544 B1
(45) Date of Patent: May 13, 2003

(54) METHOD AND APPARATUS FOR IMPROVING ACCURACY IN PHOTOLITHOGRAPHIC PROCESSING OF SUBSTRATES

(75) Inventors: David Cheung, Foster City, CA (US); Joe Feng, Santa Clara, CA (US); Judy H. Huang, Los Gatos, CA (US); Wai-Fan Yau, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1057 days.

(21) Appl. No.: 08/743,628

(22) Filed: Nov. 4, 1996

(51) Int. Cl.⁷ ............................. G03F 7/00; H01L 21/28
(52) U.S. Cl. ...................... 430/313; 430/318; 430/950; 438/902
(58) Field of Search ................................ 430/313, 318, 430/950; 438/902

(56) References Cited

U.S. PATENT DOCUMENTS

| | | |
|---|---|---|
| 4,877,641 A | 10/1989 | Dory |
| 4,992,306 A | 2/1991 | Hochberg et al. |
| 5,068,124 A | 11/1991 | Batey et al. |
| 5,219,788 A * | 6/1993 | Abernathey et al. ......... 430/318 |
| 5,600,165 A * | 2/1997 | Tsukamoto et al. ......... 257/323 |
| 5,710,061 A * | 1/1998 | Cleeves ....................... 430/313 |

FOREIGN PATENT DOCUMENTS

| | | |
|---|---|---|
| EP | 0 291 181 | 11/1988 |
| EP | 0 588 087 A2 | 3/1994 |
| EP | 0 778 496 A2 | 6/1997 |
| JP | 06 275574 | 9/1994 |
| JP | 07 201990 | 8/1995 |
| JP | 07 283198 | 10/1995 |

* cited by examiner

Primary Examiner—Kathleen Duda
(74) Attorney, Agent, or Firm—Townsend and Townsend and Crew

(57) ABSTRACT

This invention provides a method and apparatus for depositing a silicon oxide film over an antireflective layer to reduce footing experienced in the a subsequently applied photoresist layer without substantially altering the optical qualities of the antireflective layer. The invention thereby provides more accurate etching of underlying layers during patterning operations. The invention is also capable of providing more accurate patterning of thin films by reducing inaccuracies caused by excessive etching of photoresist during patterning. Additionally, the film of the present invention may be patterned and used as a mask in the patterning of underlying layers.

15 Claims, 15 Drawing Sheets

METHOD AND APPARATUS FOR IMPROVING ACCURACY IN PHOTOLITHOGRAPHIC PROCESSING OF SUBSTRATES

CROSS-REFERENCE TO RELATED APPLICATIONS

This application is related to patent application Ser. No. 08/672,888, filed Jun. 8, 1996, entitled "METHOD AND APPARATUS FOR DEPOSITING ANTIREFLECTIVE COATING," having David Cheung, Joe Feng, Judy H. Huang, and Wai-Fan Yau as inventors. Application Ser. No. 08/672,888 is assigned to Applied Materials, Inc., the assignee of the present invention, and is hereby incorporated by reference.

BACKGROUND OF THE INVENTION

The present invention relates to an apparatus for, and the processing of, semiconductor substrates. In particular, the invention relates to the patterning of thin films during substrate processing.

Since semiconductor devices were first introduced several decades ago, device geometries have decreased dramatically in size. During that time, integrated circuits have generally followed the two year/half-size rule (often called Moore's Law), meaning that the number of devices that will fit on a chip doubles every two years. Today's semiconductor fabrication plants routinely produce devices with feature sizes of 0.5 μm or even 0.35 μm, and tomorrow's plants will be producing devices with even smaller feature sizes.

A common step in the fabrication of such devices is the formation of a thin film on a substrate by chemical reaction of gases. When patterning thin films, it is desirable that fluctuations in line width and other critical dimensions be minimized. Errors in these dimensions can result in variations in device characteristics or open-/short-circuited devices, thereby adversely affecting device yield. Thus, as feature sizes decrease, structures must be fabricated with greater accuracy. As a result, some manufacturers now require that variations in the dimensional accuracy of patterning operations be held to within 5% of the dimensions specified by the designer.

Thin films are often patterned by etching away portions of the deposited layer. Modern substrate processing systems often employ photolithographic techniques in the patterning process. Typically, such photolithographic techniques employ photoresist or other light-sensitive material. In conventional processing, photoresist is first deposited on a substrate. A photomask (also known simply as a mask) having transparent and opaque regions that embody the desired pattern is positioned over the photoresist. When the mask is exposed to light, the transparent portions permit the exposure of the photoresist in those regions, but not in the regions where the mask is opaque. The light causes a chemical reaction in exposed portions of the photoresist. A suitable chemical, chemical vapor or ion bombardment process is then used to selectively attack either the reacted or unreacted portions of the photoresist. This process is known as developing the photoresist. With the remaining photoresist acting as a mask, the underlying layer may then undergo further processing. For example, material may be deposited, the underlying layer may be etched or other processing carried out.

Modern photolithographic techniques often involve the use of equipment known as steppers, which are used to mask and expose photoresist layers. Steppers often use monochromatic (single-wavelength) light, enabling them to produce the detailed patterns required in the fabrication of fine geometry devices. As a substrate is processed, however, the topology of the substrate's upper surface becomes progressively less planar. This uneven topology can cause reflection and refraction of the monochromatic light, resulting in exposure of some of the photoresist beneath the opaque portions of the mask. As a result, this uneven surface topology can alter the patterns transferred by the photoresist layer, thereby altering critical dimensions of the structures fabricated.

Reflections from the underlying layer also may cause a phenomenon known as standing waves. When a photoresist layer is deposited on a reflective underlying layer and exposed to monochromatic radiation (e.g., deep ultraviolet (UV) light), standing waves may be produced within the photoresist layer. In such a situation, the reflected light interferes with the incident light and causes a periodic variation in light intensity within the photoresist layer in the vertical direction. Standing-wave effects are usually more pronounced at the deep UV wavelengths used in modern steppers than at shorter wavelengths because many commonly used materials are more reflective at deep UV wavelengths. The use of monochromatic light, as contrasted with polychromatic (e.g., white) light, also contributes to these effects because resonance is more easily induced in monochromatic light. The existence of standing waves in the photoresist layer during exposure causes roughness in the vertical walls formed when the photoresist layer is developed, which translates into variations in line widths, spacing and other critical dimensions.

One technique helpful in achieving the necessary dimensional accuracy is the use of an antireflective coating (ARC). An ARC's optical characteristics are chosen to minimize reflections occurring at interlayer interfaces. The ARC's absorptive index is such that the amount of monochromatic light transmitted in either direction is minimized, thus attenuating both transmitted incident light and reflections thereof. The ARC's refractive and reflective indexes are fixed at values that cause any reflections, which might still occur, to be cancelled by incident light. This cancellation is accomplished by ensuring that reflected light is 180° (or 540° or another odd multiple of 180°) out-of-phase with respect to the incident light.

FIG. 1A illustrates another phenomenon often encountered in photolithography, known as footing. In a traditional photolithographic process, a layer 110, which is to be patterned, is deposited or grown on a substrate 120. In a traditional patterning process, a photoresist layer 130 is first deposited on layer 110. Photoresist layer 130 is then developed (i.e., patterned). This pattern is exemplified in FIG. 1A by a gap 140. Once photoresist layer 130 has been developed, the exposed areas of layer 110 may then be subjected to further processing, such as doping, etching or the like.

As is illustrated in FIG. 1A, after photoresist layer 130 is patterned, residual photoresist material may remain in junction areas 150 and 160. This residue, or footing, can cause variations in line width. Footing is underexposed photoresist material, which may remain at the foot of the vertical walls that are formed during the developing of photoresist layer 130. Footing is caused by the existence of amino groups ($NH_4^+$) at the surface of layer 110, and therefore is related to the amount of nitrogen contained in layer 110. Amino groups are slightly basic, and can form bonds with the photoresist material (which is slightly acidic) at a bottom portion of photoresist layer 130. When this occurs, the affected photoresist material is desensitized to radiant energy. Given this reduced photosensitivity, the bottom portion of photoresist layer 130 resists developing completely, and so may remain after the photoresist layer is developed. Some desensitized areas, such as areas in the center of gaps and large open areas, can be fully exposed by simply increasing the exposure's duration.

However, an exposure of longer duration may not be effective in exposing desensitized photoresist material in areas such as junction areas 150 and 160. Radiant energy, after passing through an opening, will vary in intensity with the angle from the opening's centerline. On average, the radiant energy's intensity falls as the angle from the opening's centerline increases, relative to the intensity maximum that exists at the opening's centerline. This is in accordance with Young's theory, which predicts this type of diffraction phenomenon. Thus, a longer-duration exposure may alter the resulting line width, but does not avoid the formation of footing.

The opening at the top of a gap, such as gap 140, may create such variations in intensity within the gap. Because it is at an angle from the opening's centerline (i.e., from the center of gap 140), the photoresist in junction areas 150 and 160 receives less radiant energy due to the optical mechanics of gap 140, even though the photoresist in the center of gap 140 is fully exposed. This, in turn, may result in the photoresist in junction areas 150 and 160 not being fully developed. During the subsequent patterning of layer 110, this residual material protects portions of layer 110, thereby causing the resulting line widths to deviate from intended dimensions.

The preceding description of footing is given with respect to a positive photoresist. As previously noted, photoresist is an organic compound, the solubility of which changes when exposed to certain wavelengths of radiant energy. The regions in the photoresist exposed to light become either more soluble or less soluble in a solvent called a developer. When the exposed regions become more soluble, a positive image of the mask is defined in the photoresist. This is known as a positive photoresist. If the irradiated regions become less soluble in the developer, while the nonirradiated regions remain soluble, a negative image of the mask is defined in the photoresist. This is known as a negative photoresist. A negative photoresist is believed to suffer from a similar, but opposite effect, where material is etched away from underneath portions of exposed resist, creating "negative footing." This, too, is a problem that needs to be addressed.

Yet another phenomenon encountered in photolithography is the varying etch selectively exhibited by various materials with respect to the etchants used in the patterning of layer 110. Etch selectivity indicates a material's reactivity with respect to a given etchant in relationship to that of another material. Etch selectivity is usually denoted by a ratio of the etch rate of one material to that of another, and is usually taken with respect to the material of the layer being etched. High etch selectivity is therefore often desirable because, ideally, an etchant should selectively etch only the intended areas of the layer being patterned and not erode other structures that may already exist on the substrate being processed.

High etch selectivity is desirable in a photoresist layer because it translates into improved accuracy when transferring a mask pattern to the underlying layer. If a photoresist layer's etch selectivity is low, the etching operation may remove not only the exposed portions of the layer being patterned, but also portions of the photoresist layer. While the removal of some photoresist material during etching is normal, extremely low etch selectivity may cause the photoresist layer to be etched through (or back, away from the exposed areas of the layer being patterned) to the point that portions of the layer being patterned, which should have been protected, are also exposed to the etchant.

The phenomenon referred to herein as photoresist etchback is illustrated in FIG. 1B by the difference between an intended profile 270 and the actual profile of a gap 245. Because the etch selectivity of photoresist layer 220 is low, photoresist layer 220 is etched back from gap 245 during the patterning of an underlying layer 230. Without a layer of photoresist material to protect it, the additional portion of underlying layer 230 encompassed by intended profile 270 is etched away, along with the portions of underlying layer 230 originally intended for removal.

The phenomenon referred to herein as etch-through is illustrated in FIG. 1B by an etch-through 260. Etch-through occurs when photoresist layer 220, due to its low etch selectivity, is substantially etched away in a given area during the patterning of underlying layer 230. Such overetching may cause undesirable variations in surface topology and device characteristics, and may even render devices thus fabricated inoperable. Although a thicker photoresist layer may be employed to reduce over-etching, thicker photoresist layers may require longer development times. Also, even if the photoresist layer is applied in greater thicknesses, over-etching may still occur if the photoresist layer is not applied evenly.

It is therefore desirable to provide a technique that reduces the footing experienced by a photoresist layer used in patterning a thin film in order to improve the accuracy of the patterning process. Additionally, it is desirable to ensure the protection of unexposed areas of the layer being patterned. However, such techniques should not interfere with desirable optical qualities possessed by an associated ARC layer.

SUMMARY OF THE INVENTION

The present invention addresses these requirements by providing an apparatus and a process for depositing a low nitrogen content layer to reduce footing experienced in a subsequently applied photoresist layer, without substantially adversely altering the optical qualities of an associated antireflective layer (i.e., antireflective coating, or ARC).

According to the method of the present invention, a low nitrogen content layer is deposited over the upper surface of an ARC to reduce the number of amino groups presented to a subsequently applied photoresist layer, thereby reducing footing experienced in the photoresist layer. The method of the present invention begins by depositing an ARC, which is preferably a layer of silicon oxynitride ($SiO_xN_y$) or silicon nitride ($SiN_x$), over a substrate. The ARC is deposited to reduce the reflection and refraction of incident radiant energy occurring in a subsequently applied photoresist layer. Next, a low nitrogen content layer, such as a silicon oxide layer, is deposited. This layer is referred to herein as a capping layer. The capping layer passivates amino groups that may exist at the upper surface of the ARC, thereby improving the accuracy with which the substrate is patterned. The capping layer's thickness is selected so that it does not substantially adversely alter the ARC's optical qualities. The photoresist layer is then deposited over the capping layer, after which a traditional patterning process is followed, including developing the photoresist, patterning the substrate, and removing the remaining photoresist, capping layer and ARC material after the substrate has been patterned.

In one embodiment, for example, radiant energy having a wavelength of 248 nm is used. This mandates a capping layer that is preferably between about 50 Å and 150 Å in thickness. However, the use of radiant energy sources with different wavelengths may require the use of different thickness ranges. Moreover, the materials used to form the substrate, the ARC and the photoresist layer, along with other parameters, will affect the capping layer thickness selected.

In another embodiment, the present invention is used both to reduce footing in a photoresist layer and to improve pattern transfer from a mask to a substrate. Such a layer is referred to as a hardmask. A hardmask is deposited over an ARC, preferably to between about 700 Å and 1100 Å in thickness, although greater thicknesses may be used as long as the ARC's optical qualities are not substantially adversely altered. These greater thicknesses are approximately equal to the thickness of a corresponding capping layer plus a whole multiple of about 800 Å. A hardmask helps to protect the substrate during patterning operations by providing an additional thickness of protective material and, in some cases, a layer having a high etch selectivity, without substantially adversely altering the ARC's optical qualities. This addresses over-etching of the photoresist layer via phenomena such as etch-back (the etching of material back from open areas) and etch-through (the etching of photoresist material exposing the underlying layer). A hardmask according to the present invention is thus capable of providing more accurate fabrication of structures by muting the effects caused by the excessive erosion of photoresist material during the patterning process.

A further understanding of the nature and advantages of the present invention may be realized by reference to the remaining portions of the specification and the drawings.

DESCRIPTION OF THE SPECIFIC EMBODIMENTS

I. Introduction

The present invention is a low nitrogen content layer (e.g., a silicon oxide layer) that can be employed to reduce footing in photoresist layers thereby providing a more accurate transfer of an original mask pattern to the layer being patterned. In certain embodiments, the present invention can also be employed to reduce photoresist etch-back and etch-through problems experienced in some photolithography operations. The layer of the present invention can be deposited in deposition chambers of conventional design.

II. An Exemplary CVD System

Figure 2A:
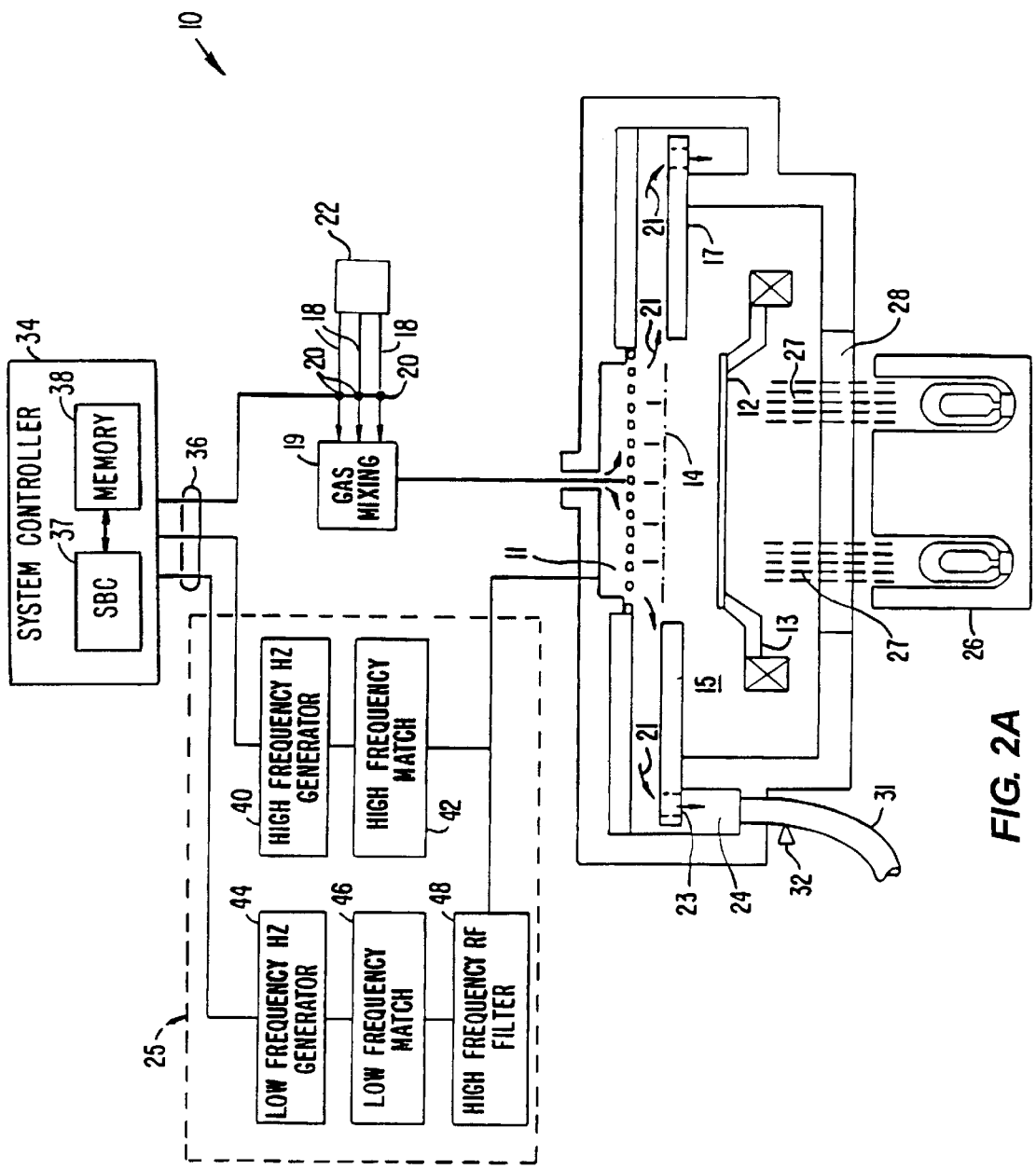
FIG. 2A is a vertical, cross-sectional view of one embodiment of a simplified chemical vapor deposition (CVD) apparatus, which may be used for depositing a film according to the present invention.

FIG. 2A illustrates one embodiment of a simplified, parallel-plate plasma enhanced chemical vapor deposition (PECVD) system 10 having a processing chamber 15 in which a film according to the present invention may be deposited. The illustration of PECVD system 10 is simplified for purposes of this discussion. PECVD system 10 contains a gas distribution manifold 11 for dispersing process gases through perforated holes in manifold 11 to a wafer (not shown) that rests on a susceptor 12. Susceptor 12 is highly heat responsive and is mounted on supports 13 so that susceptor 12 (and the wafer supported on the upper surface of susceptor 12) can be moved controllably between a lower loading/off-loading position and an upper processing position 14 that is closely adjacent to manifold 11. A center board (not shown) includes sensors for providing information on the position of the wafer.

When susceptor 12 and the wafer are in processing position 14, they are surrounded by a baffle plate 17 having a plurality of spaced holes 23 that exhaust into an annular vacuum manifold 24. A process gas source 22 supplies deposition and carrier gases through supply lines 18 into a mixing system 19, where they are combined and then sent to manifold 11. Gases supplied by process gas source 22 may included gases (or vaporized compounds) such as silane, oxygen, nitrogen, helium and other compounds useful in the processing of substrates. Generally, supply lines 18 for each of the process gases include (i) safety shut-off valves (not shown) that can be used to automatically or manually shut off the flow of process gas into the chamber, and (ii) mass flow controllers 20 that measure the flow of gas or liquid through the supply lines. When toxic gases are used in the process, the several safety shut-off valves are positioned on each gas supply line in conventional configurations. The rate at which deposition and carrier gases are supplied to gas mixing system 19 is controlled by liquid or gas mass flow controllers 20 and/or by valves. During processing, gas supplied to manifold 11 is vented toward and uniformly distributed radially across the surface of the wafer in a laminar flow as indicated by arrow 21. An exhaust system then exhausts the gas via spaced holes 23 into the annular vacuum manifold 24 and out an exhaust line 31 by a vacuum pump system (not shown). The rate at which gases are released through exhaust line 31 is controlled by a throttle valve 32.

The deposition process performed in PECVD system 10 can be either a thermal process or a plasma-enhanced process. In a plasma process, a controlled plasma is formed adjacent to the wafer by radio frequency (RF) energy applied to manifold 11 from RF power supply 25. Manifold 11 is also an RF electrode, whereas susceptor 12 is grounded. RF power supply 25 can supply either single or mixed frequency RF power (or other desired variation) to manifold 11 to enhance the decomposition of reactive species introduced into processing chamber 15. The mixed frequency RF power is generated by a high frequency RF generator 40 (RF1) and corresponding match circuit 42 and a low frequency RF generator 44 (RF2) and corresponding match circuit 46. A high frequency filter 48 prevents voltage generated by high frequency generator 40 from damaging the low frequency generator.

Heat is distributed by an external lamp module 26. External lamp heater module 26 provides a collimated annular pattern of light 27 through a quartz window 28 onto an annular peripheral portion of susceptor 12. Such heat distribution compensates for the natural heat loss pattern of the susceptor and provides rapid and uniform heating of the susceptor and wafer for effecting deposition.

Typically, any or all of the chamber lining, gas distribution manifold faceplate, supports 13 and various other reactor hardware is made out of material such as aluminum or anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In situ Multi-step Planarized Process," issued to Chang et al. and assigned to Applied Materials, Inc., the assignee of the present invention, which is incorporated herein by reference for all purposes.

A motor (not shown) raises and lowers susceptor 12 between a processing position 14 and a lower, wafer-loading position. Motors and optical sensors are used to move and determine the position of movable mechanical assemblies such as throttle valve 32 and susceptor 12. The heater, motors, valves or flow controllers 20 connected to supply lines 18, gas delivery system, throttle valve 32, RF power supply 25, and lamp magnet drivers are all controlled by a system controller 34 over control lines 36 of which only some are shown.

System controller 34 controls all of the activities of the CVD machine. The system controller executes system control software, which is a computer program stored in a computer-readable medium such as a memory 38. Preferably, memory 38 may be a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Of course, other computer programs such as one stored on another memory device including, for example, a floppy disk or other another appropriate drive, may also be used to operate system controller 34.

In a preferred embodiment, the system controller includes a hard disk drive (memory 38), a floppy disk drive and a card rack. The card rack contains a single-board computer (SBC) processor 37, analog and digital input/output boards, interface boards and stepper motor controller boards. Various parts of PECVD system 10 conform to the Versa Modular European (VME) standard that defines board, card cage and connector dimensions and types. The VME standard also defines the bus structure having a 16-bit data bus and 24-bit address bus.

Figure 2B:
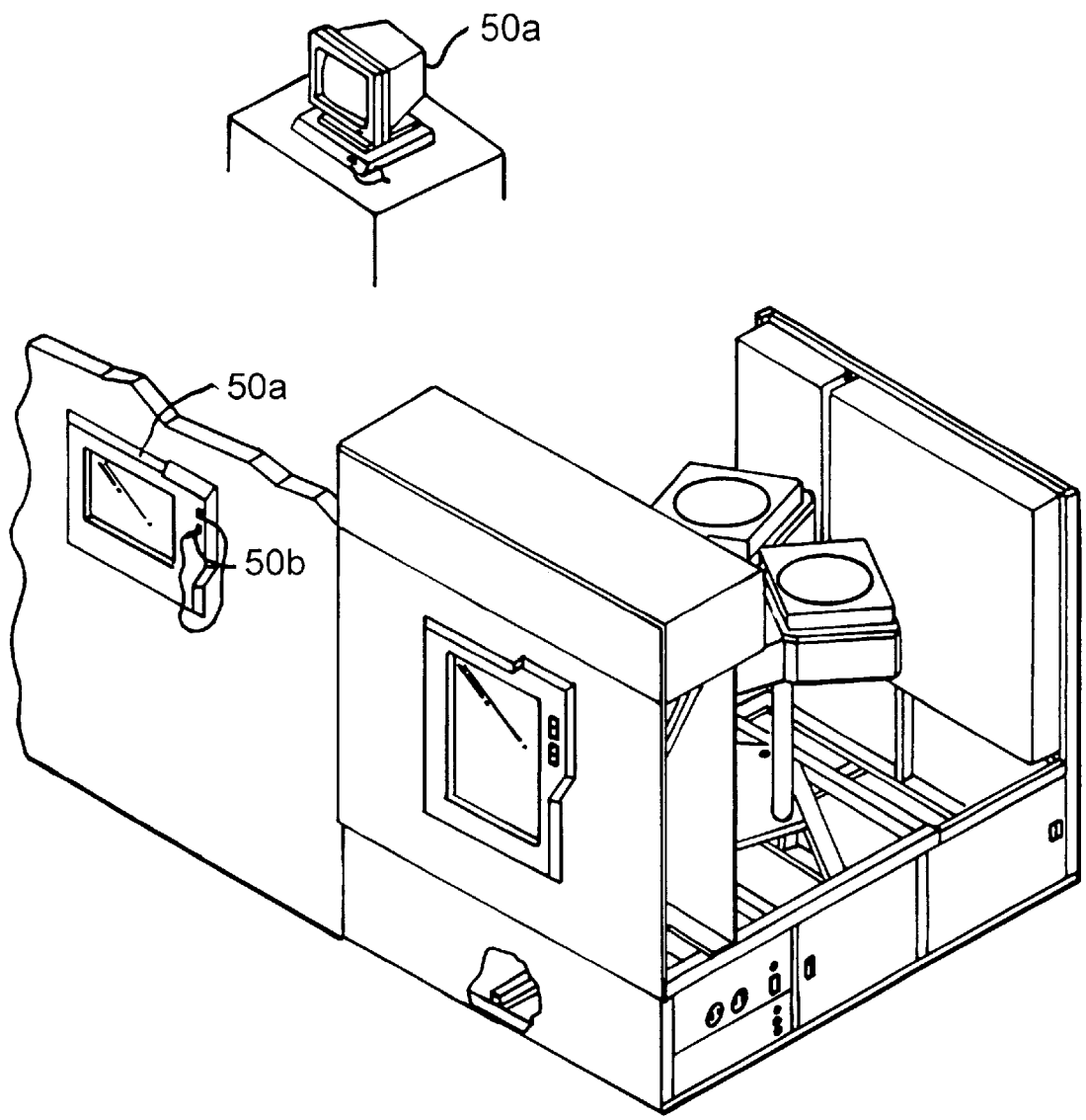
FIG. 2B is a simplified diagram of a system monitor and the CVD system of FIG. 2A in a multichamber system, which may include one or more chambers.

The interface between a user and system controller 34 is via a CRT monitor 50*a* and light pen 50*b,* as shown in FIG. 2B, which is a simplified diagram of the system monitor and PECVD system 10 in a multichamber system, which may, in the alternative, be a single-chamber system. In the preferred embodiment two monitors 50*a* are used, one mounted in the clean room wall for the operators and the other behind the wall for the service technicians. Both monitors 50*a* simultaneously display the same information, but only one light pen 50*b* is enabled. The light pen 50*b* detects light emitted by CRT display with a light sensor in the tip of the pen. To select a particular screen or function, the operator touches a designated area of the display screen and pushes the button on light pen 50*b*. The touched area changes its highlighted color, or a new menu or screen is displayed, confirming communication between the light pen and the display screen. Of course, other input devices, such as a keyboard, mouse or other pointing or communication device, may be used instead of or in addition to light pen 50*b* to allow the user to communicate with system controller 34.

The process for depositing a film onto a wafer can be implemented using a computer program product that is executed by system controller 34. The computer program code can be written in any conventional computer readable programming language, such as 68000 assembly language, C, C++, Pascal, Fortran or others. Suitable program code is entered into a single file, or multiple files, using a conventional text editor, and stored or embodied in a computer-usable medium, such as a memory system of the computer. If the entered code text is in a high level language, the code is compiled, and the resultant compiler code is then linked with an object code of precompiled library routines. To execute the linked, compiled object code, the system user invokes the object code, causing the computer system to load the code in memory, from which the CPU reads and executes the code to perform the tasks identified in the program.

Figure 2C:
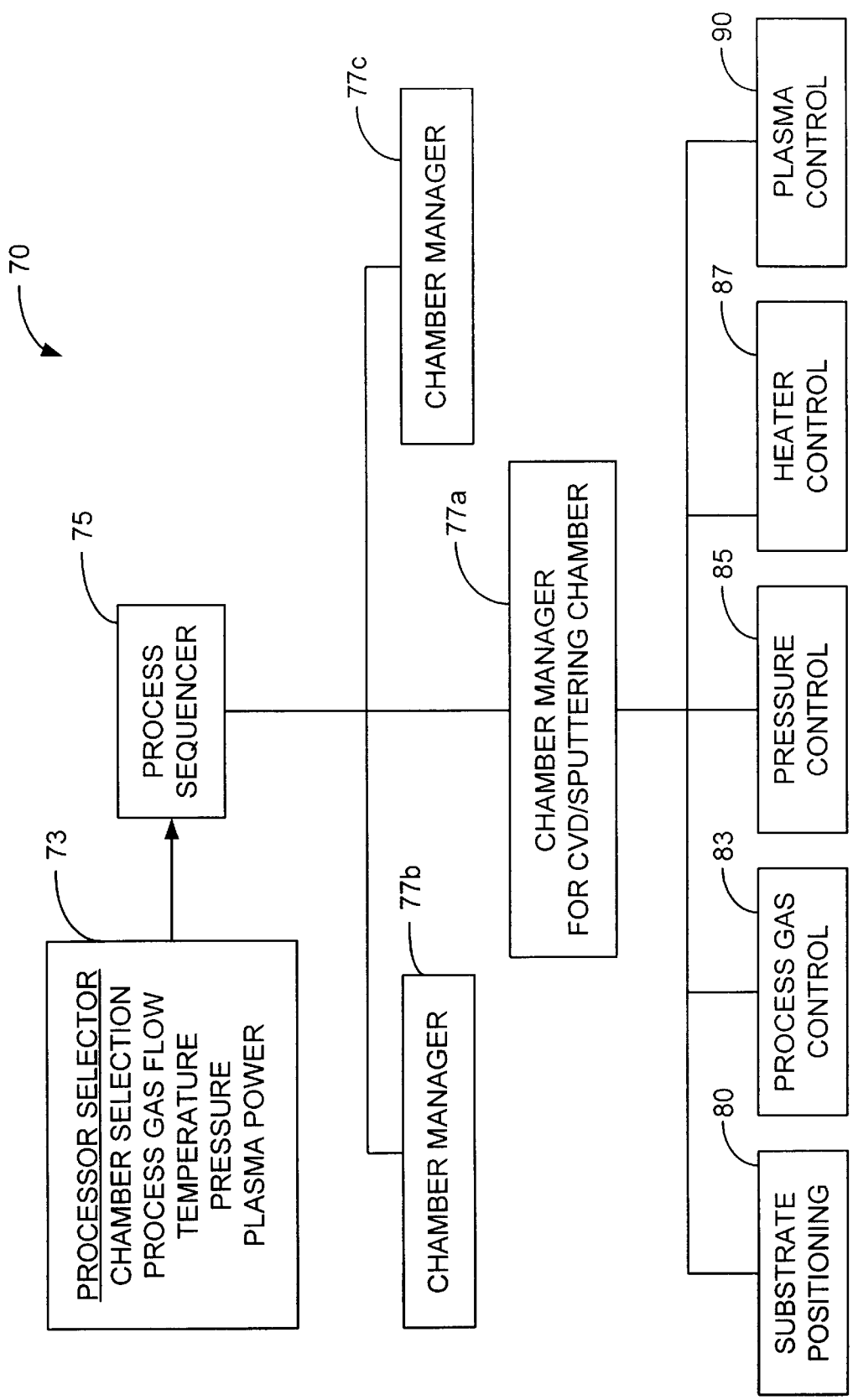
FIG. 2C shows an illustrative block diagram of the hierarchical control structure of the system control software used to control the operation of the CVD system shown in FIG. 2A according to a specific embodiment.

FIG. 2C shows an illustrative block diagram of the hierarchical control structure of the system control software, computer program 70, according to a specific embodiment. A user enters a process set number and process chamber number into a process selector subroutine 73 in response to menus or screens displayed on the CRT monitor by using the light pen interface. The process sets are predetermined sets of process parameters necessary to carry out specified processes, and are identified by predefined set numbers. The process selector subroutine 73 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure and chamber wall temperature, and are provided to the user in the form of a recipe. The parameters specified by the process recipe are entered utilizing the light pen/CRT monitor interface. The signals for monitoring the process are provided by the analog input and digital input boards of the system controller, and the signals for controlling the process are output on the analog output and digital output boards of PECVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the sequencer subroutine 75 includes a program code to perform the steps of (i) monitoring the operation of the process chambers to determine if the chambers are being used, (ii) determining what processes are being carried out in the chambers being used and (iii) executing the desired process based on availability of a process chamber and type of process to be carried out. Conventional methods of monitoring the process chambers can be used, such as polling. When the user schedules which process is to be executed, the sequencer subroutine 75 can be designed to take into consideration the present condition of the process chamber being used in comparison with the desired process conditions for a selected process, or the "age" of each particular user-entered request, or any other relevant factor a system programmer desires to include for determining scheduling priorities.

Once the sequencer subroutine 75 determines which process chamber and process set combination should be executed next, the sequencer subroutine 75 executes the process set by passing the particular process set parameters to a chamber manager subroutine 77a–c that controls multiple processing tasks in processing chamber 15 according to the process set determined by the sequencer subroutine 75. For example, the chamber manager subroutine 77a comprises program code for controlling sputtering and CVD process operations in processing chamber 15. The chamber manager subroutine 77a also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87 and plasma control subroutine 90. Those having ordinary skill in the art would readily recognize that other chamber control subroutines can be included depending on what processes are desired to be performed in processing chamber 15. In operation, the chamber manager subroutine 77a selectively schedules or calls the process component subroutines in accordance with the particular process set being executed. The chamber manager subroutine 77a schedules the process component subroutines similarly to how the sequencer subroutine 75 schedules which processing chamber 15 and process set is to be executed next. Typically, the chamber manager subroutine 77a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2C. The substrate positioning subroutine 80 comprises program code for controlling chamber components that are used to load the substrate onto the susceptor 12, and optionally to lift the substrate to a desired height in processing chamber 15 to control the spacing between the substrate and the gas distribution manifold 11. When a substrate is loaded into processing chamber 15, the susceptor 12 is lowered to receive the substrate, and thereafter, the susceptor 12 is raised to the desired height in the chamber to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives process parameters related to the desired gas flow rates from the chamber manager subroutine. Typically, the process gas control subroutine 83 operates by opening the gas supply lines, and repeatedly (i) reading the necessary mass flow controllers, (ii) comparing the readings to the desired flow rates received from the chamber manager subroutine 77a and (iii) adjusting the flow rates of the gas supply lines as necessary. Furthermore, the process gas control subroutine 83 includes steps for monitoring the gas flow rates for unsafe rates, and activating the safety shut-off valves when an unsafe condition is detected.

In some processes, an inert gas such as argon is directed into processing chamber 15 to stabilize the pressure in the chamber before reactive process gases are introduced into the chamber. For these processes, the process gas control subroutine 83 is programmed to include steps for flowing the inert gas into processing chamber 15 for an amount of time necessary to stabilize the pressure in the chamber, and then the steps described above would be carried out. Additionally, when a process gas is to be vaporized from a liquid precursor, such as tetraethoxysilane (TEOS), the process gas control subroutine 83 would be written to include steps for bubbling a delivery gas, such as helium, through the liquid precursor in a bubbler assembly or introducing a carrier gas, such as helium, to a liquid injection system. When a bubbler is used for this type of process, the process gas control subroutine 83 regulates the flow of the delivery gas, the pressure in the bubbler and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in processing chamber 15 by regulating the size of the opening of the throttle valve in the exhaust system of the chamber. The size of the opening of the throttle valve is set to control the chamber pressure to the desired level in relation to the total process gas flow, size of the process chamber and pumping setpoint pressure for the exhaust system. When the pressure control subroutine 85 is invoked, the desired, or target, pressure level is received as a parameter from the chamber manager subroutine 77*a*. The pressure control subroutine 85 operates to measure the pressure in processing chamber 15 by reading one or more conventional pressure nanometers connected to the chamber, comparing the measure value(s) to the target pressure, obtaining PID (proportional, integral, and differential) values from a stored pressure table corresponding to the target pressure, and adjusting the throttle valve according to the PID values obtained from the pressure table. Alternatively, the pressure control subroutine 85 can be written to open or close the throttle valve to a particular opening size to regulate processing chamber 15 to the desired pressure.

The heater control subroutine 87 comprises program code for controlling the temperature of external lamp module 26 that is used to heat the substrate. The heater control subroutine 87 is also invoked by the chamber manager subroutine 77*a* and receives a target, or set-point, temperature parameter. The heater control subroutine 87 measures the temperature by measuring voltage output of a thermocouple located in a susceptor 12, compares the measured temperature to the set-point temperature, and increases or decreases current applied to external lamp module 26 to obtain the set-point temperature. The temperature is obtained from the measured voltage by looking up the corresponding temperature in a stored conversion table, or by calculating the temperature using a fourth-order polynomial. When radiant lamps are used to heat the susceptor 12, the heater control subroutine 87 gradually controls a ramp up/down of current applied to the lamp. The gradual ramp up/down increases the life and reliability of the lamp. Additionally, a built-in, fail-safe mode can be included to detect process safety compliance, and can shut down operation of external lamp module 26 if processing chamber 15 is not properly set up.

The plasma control subroutine 90 comprises program code for setting the low and high frequency RF power levels applied to the process electrodes in processing chamber 15, and to set the low frequency RF frequency employed. Similar to the previously described chamber component subroutines, the plasma control subroutine 90 is invoked by the chamber manager subroutine 77*a*.

The above description is mainly for illustrative purposes and should not be considered as limiting the scope of the present invention. Variations of the above described system such as variations in supporter design, heater design, location of RF power connections and other variations are possible. For example, the wafer could be supported and heated by a resistively heated platen. Additionally, other plasma CVD equipment such as electron cyclotron resonance (ECR) plasma CVD equipment, induction-coupled RF high density plasma CVD equipment, or the like may be employed. Films and deposition rates other than those disclosed may also be used with the method of the present invention. A capping layer/hardmask and method for forming such films according to the present invention are therefore not limited to any specific apparatus or method.

III. Exemplary Structures

A capping layer, according to the present invention, is a layer of low nitrogen content material deposited between an ARC and a photoresist layer to reduce footing in the photoresist layer during the patterning process without substantially adversely affecting the ARC's optical qualities. Deposited in an appropriate thickness, a capping layer may also serve as a means of protecting the underlying layer. In this capacity, a capping layer is referred to herein as a hardmask. Also, by patterning a hardmask using a photoresist layer, the hardmask may be used to pattern an underlying layer.

A. An Exemplary Structure Employing a Capping Layer

Figure 3A:
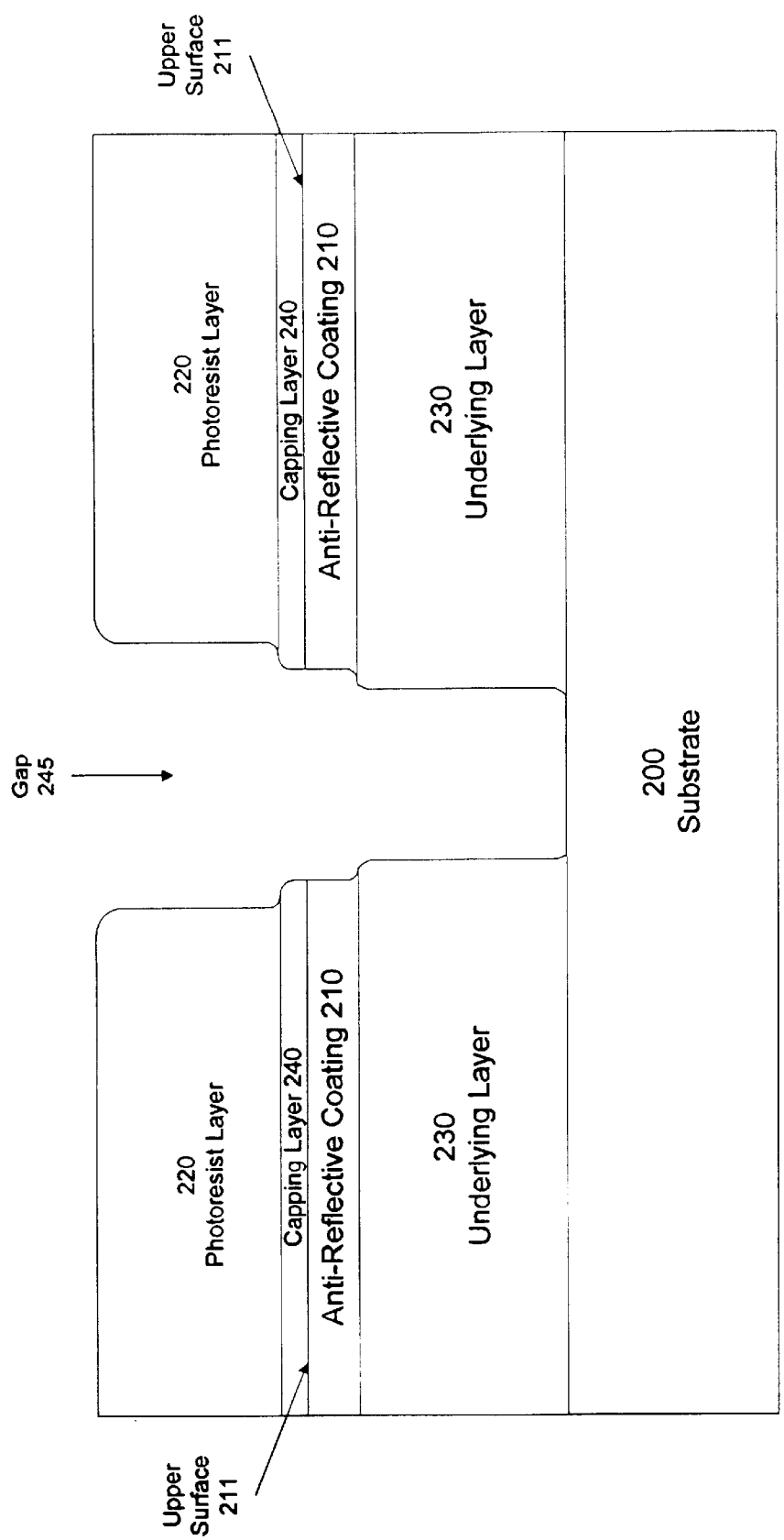
FIG. 3A is a simplified cross-sectional view of an integrated circuit according to the present invention showing an ARC structure having a capping layer.

FIG. 3A is a simplified cross-sectional view of a substrate 200 according to one embodiment of the present invention. In FIG. 3A, a capping layer of the present invention (capping layer 240) is deposited between conventional photoresist and ARC layers (photoresist layer 220 and ARC 210, respectively). As previously described, ARC 210 reduces reflections, standing waves and other optical phenomena within photoresist layer 220. This reduces variations in the patterns created during the exposure of photoresist layer 220 and increases the accuracy of pattern transfer between a mask (not shown) and photoresist layer 220. ARC 210 is preferably a layer of silicon oxynitride ($SiO_XN_Y$), with a refractive index (n), absorptive index (k), reflectance (r) and thickness (t) selected to minimize reflections at the wavelength of radiant energy employed. These parameters are also selected with regard to the material upon which ARC 210 is deposited (i.e., the composition of underlying layer 230).

For use in ARCs, a silicon oxynitride compound is preferred over traditional organic compounds for at least the following reasons. First, silicon oxynitride is preferable because of the ease with which such a process may be integrated with other substrate processing operations, and the material's well-understood optical qualities and process parameters. Additionally, nitrogen, in the form of nitrogen-containing substances such as nitrogen ($N_2$), may be added to a silicon oxide film to subtly alter the film's optical qualities. This permits accurate control of the film's optical parameters such as refractive and absorptive indexes.

Used alone, however, an ARC containing a given amount of nitrogen will cause a corresponding degree of footing in a subsequently applied photoresist layer, thereby reducing patterning accuracy. As noted, this is due to the photoresist material's bonding with amino groups ($NH_4^+$) at an upper surface 211 of ARC 210. Thus, because ARC 210 is preferably a silicon oxynitride ($SiO_XN_Y$) layer, some degree of footing can be expected to occur in photoresist layer 220. At least two solutions to this problem exist. One solution is to reduce the amount of nitrogen contained in ARC 210. This might be accomplished, for example, by modifying one or more process parameters, such as the nitrogen flow rate. However, such a change in process parameters will likely cause undesired side-effects such as altering the optical qualities of ARC 210, which may require further changes in the process parameters (if, indeed, it is possible to correct for the nitrogen deficiency). Additionally, it may not be possible to reduce the nitrogen content sufficiently to adequately reduce footing while maintaining acceptable optical qualities in ARC 210. A second alternative is to passivate the amino groups by providing a material to which the amino groups at upper surface 211 may bond. According to the present invention, this may be done by depositing a low nitrogen content layer over ARC 210.

FIG. 3A illustrates a structure according to the present invention having such a layer, which is shown as a capping layer 240. Capping layer 240 is a layer of low nitrogen content material, such as silicon oxide, deposited between ARC 210 and photoresist layer 220 to reduce footing in photoresist layer 220. Preferably, capping layer 240 is deposited to a thickness of between about 50 Å and 150 Å when the wavelength of radiant energy used to develop photoresist layer 220 is about 248 nm. These thicknesses are the minimum thicknesses to which capping layers can be deposited while minimizing reflections from ARC 210 and underlying layer 230.

These thicknesses were found to be preferable by simulation and experimentation. Capping layers were deposited to a thickness of approximately 100 Å, which provided a substantial reduction in footing without noticeably affecting the ARC's photolithographic performance. Additionally, simulations were performed that paralleled these results. These results are further explained in the section on experimental results.

However, the optimal thickness of capping layer 240 varies with the composition of underlying layer 230. This is especially true if capping layer 240 is $SiO_X$, in which case the optical parameters of capping layer 240 are simply those of a typical $SiO_X$ layer. Thus, only thickness remains as a means of adjusting the optical qualities of capping layer 240. The thickness of capping layer 240 must therefore be adjusted to account for the optical qualities of the interface between ARC 210 and underlying layer 230.

Figure 1A:
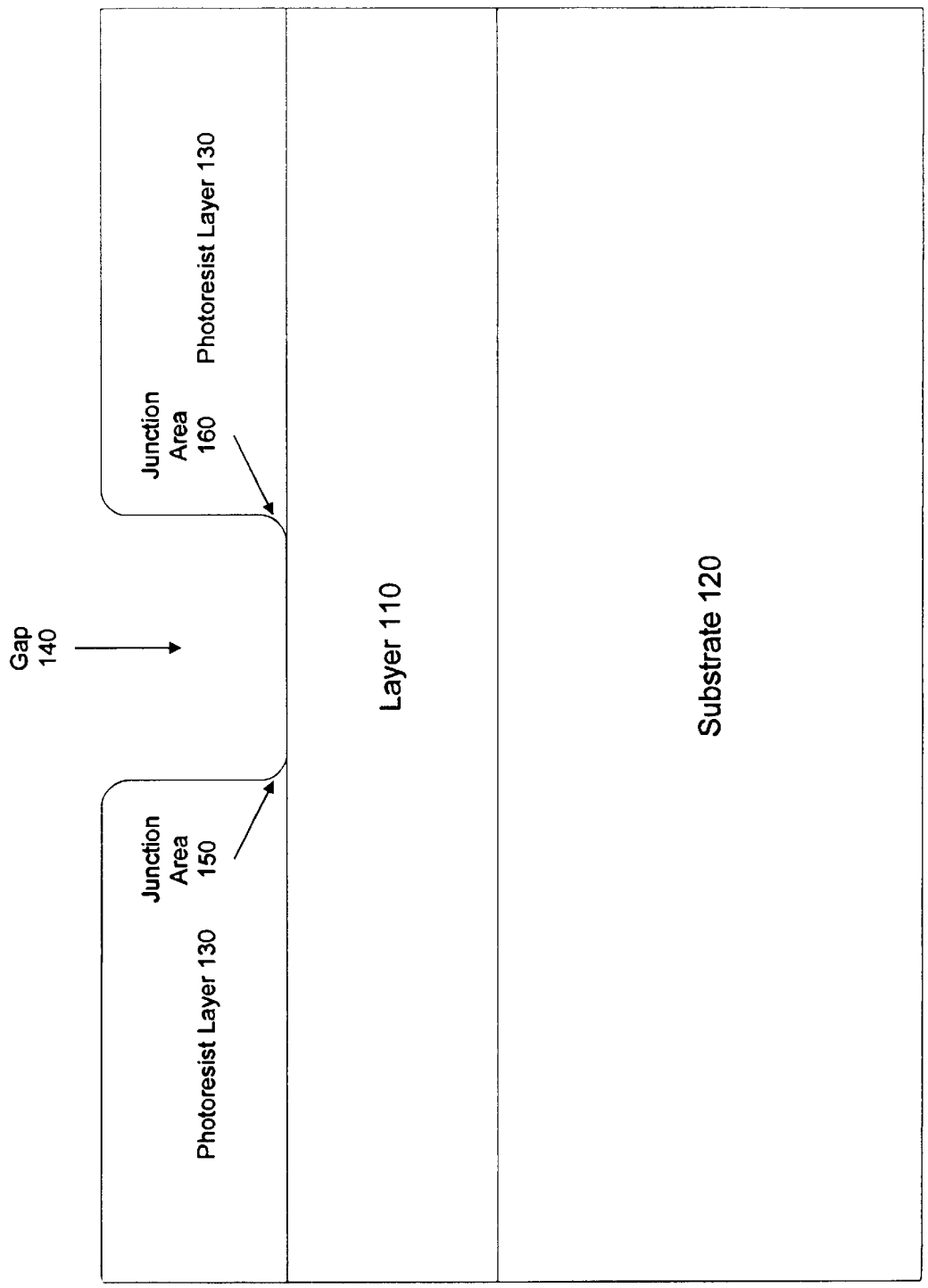
FIG. 1A is a simplified cross-sectional view of an integrated circuit of the prior art showing a photoresist layer having footing.
Figure 1B:
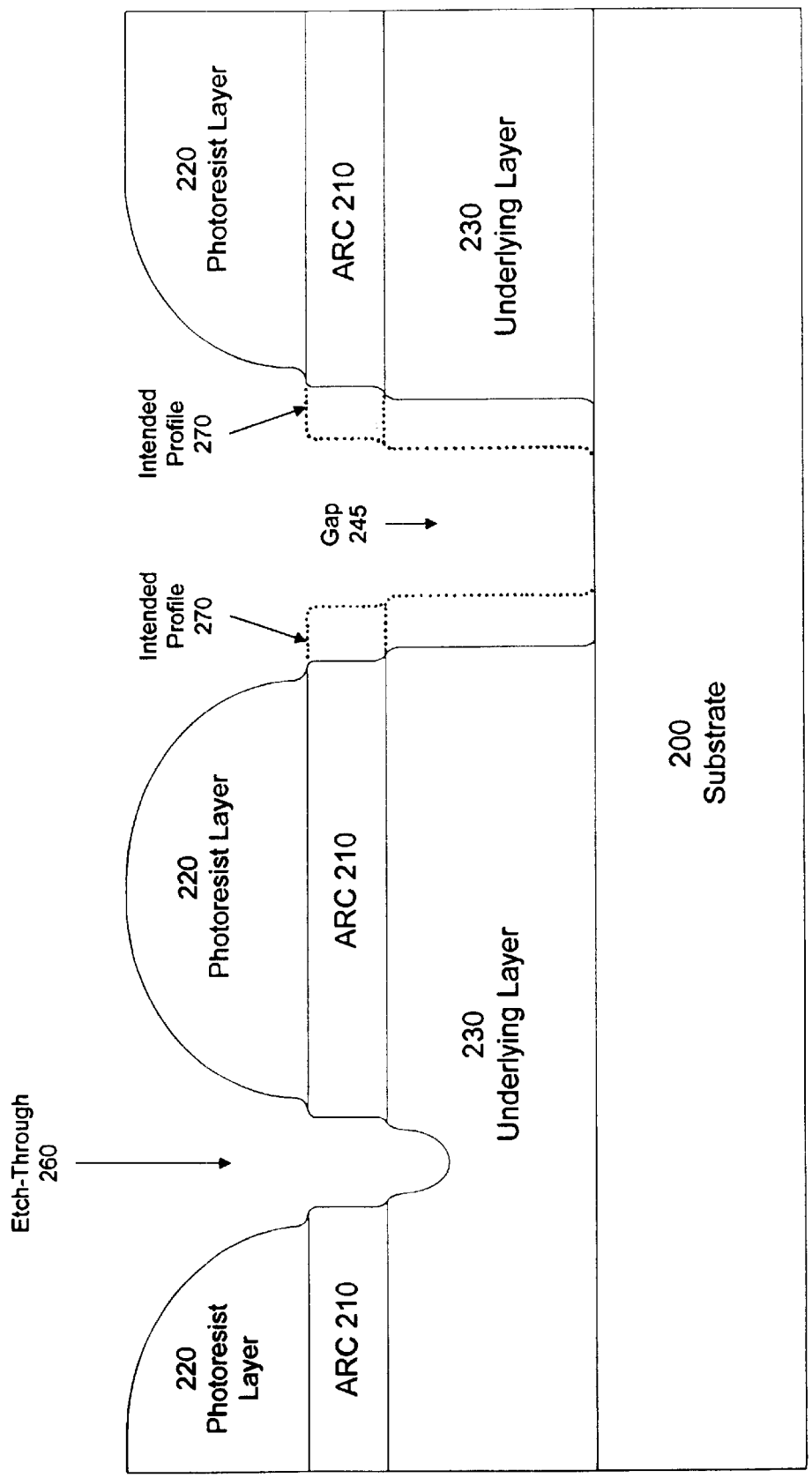
FIG. 1B is a simplified cross-sectional view of an integrated circuit of the prior art showing the effects of low etch selectivity.

Capping layer 240 provides several benefits. Capping layer 240 reduces footing without adversely affecting reflectivity at the photoresist/oxide interface or other aspects of the photolithographic performance of ARC 210 by covering upper surface 211 of ARC 210 with a low nitrogen content layer. In essence, the amino groups at upper surface 211 bond to capping layer 240. Because capping layer 240 contains little or no nitrogen, a minimal number amino groups are presented to photoresist layer 220. Without these amino groups, the developing process is able to more completely remove the photoresist material in junction areas, such as junction areas 150 and 160 in FIG. 1A, thereby reducing footing and increasing the accuracy of the patterning process.

The present invention also allows an ARC to be optimized for the material upon which it will be deposited (e.g., aluminum, polysilicon or tungsten silicide) without regard for footing or the effects of a capping layer deposited to reduce that footing. A capping layer may be applied over the ARC with substantially no adverse effects on the ARC's photolithographic performance. This is preferable to alternatives such as increasing an ARC's thickness, or altering the ARC's composition to reduce footing, because a change in ARC thickness or composition would require reoptimization of the ARC's optical parameters. Thus, an ARC process optimized for a particular underlying layer need not be altered to take advantage of the present invention. Moreover, aside from not requiring reoptimization of the process, a process capable of depositing a $SiO_XN_Y$-based ARC may also be used to deposit, in-situ, a structure having an ARC and capping layer, with little modification of the original process recipe.

B. An Exemplary Structure Employing a Hardmask

Figure 3B:
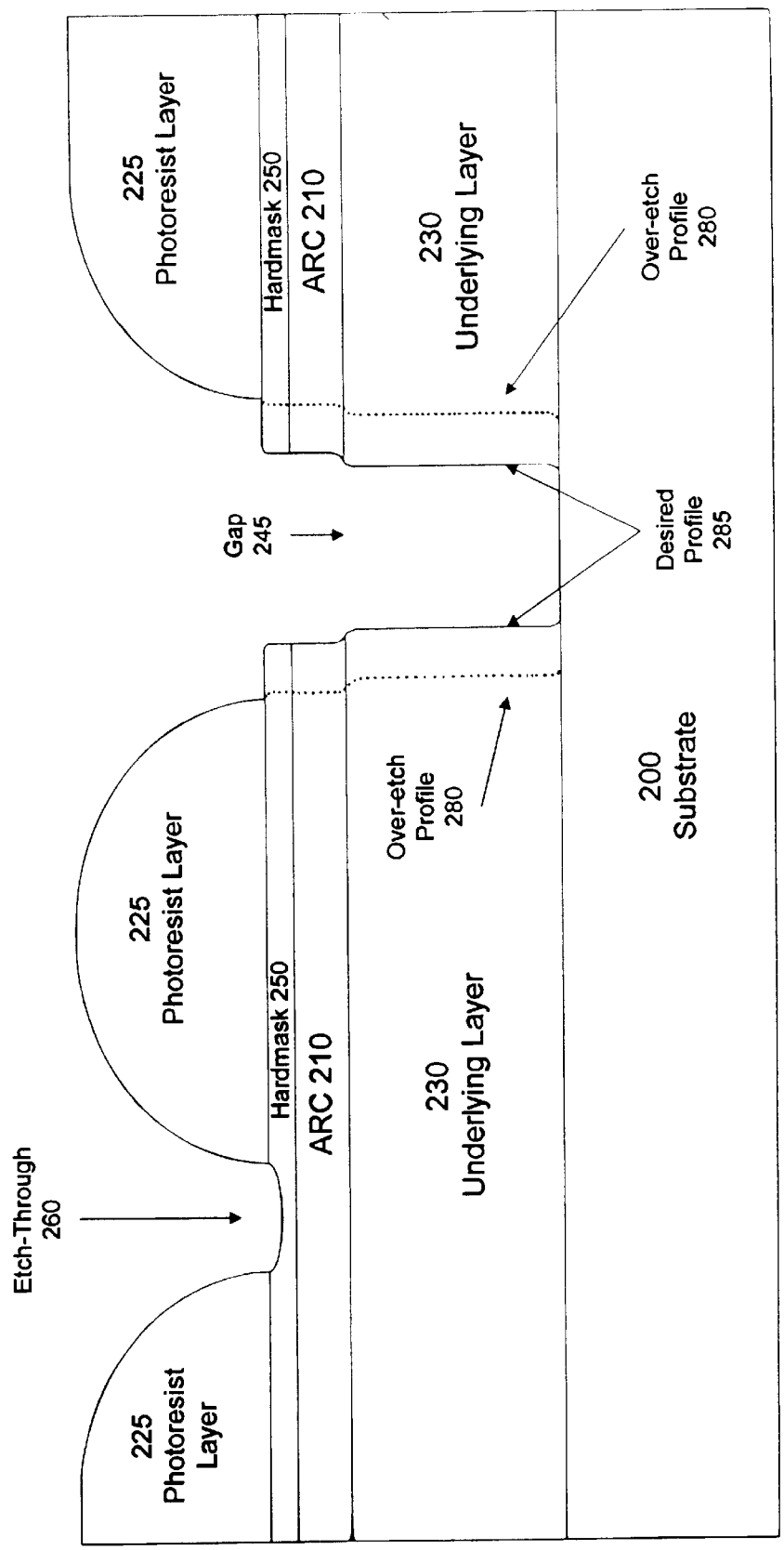
FIG. 3B is a simplified cross-sectional view of an integrated circuit according to the present invention showing an ARC structure having a hardmask layer, in a situation where a photoresist layer exhibits low etch selectivity with regard to a layer being patterned.

FIG. 3B is a simplified cross-sectional view of substrate 200 according to another embodiment of the present invention. In FIG. 3B, a low nitrogen content layer is deposited to a thickness sufficient to form a hardmask 250. Hardmask 250, deposited between ARC 210 and a photoresist layer 225, improves accuracy in the transfer of a pattern from a mask (not shown) to underlying layer 230 in at least two ways. First, hardmask 250 reduces footing, by passivating amino groups existing at the upper surface of ARC 210, in the manner previously described. Second, hardmask 250 protects underlying layer 230 in the event that photoresist layer 225 exhibits low etch selectivity, avoiding inaccuracies in patterning caused by the over-etching of photoresist layer 225.

Hardmask 250 is preferably deposited to a thickness between about 700 Å and 1100 Å, significantly thicker than the 50 Å-to-150 Å thickness preferable with capping layer 240. However, the optimal thickness of hardmask 250 varies with the composition of underlying layer 230, in a fashion similar to that of capping layer 240. Again, the thickness must be adjusted to minimize any adverse effects on the advantageous optical qualities of ARC 210. For example, hardmask 250 is preferably about 900 Å in thickness when underlying layer 230 is composed of tungsten silicide ($WSi_X$) or polysilicon, but is preferably about 850 Å in thickness when underlying layer 230 is composed of aluminum. Thus, the thickness of hardmask 250 must be adjusted to account for the optical qualities of the interface between ARC 210 and underlying layer 230 (e.g., minimizing reflectance, not altering the phase shift caused by ARC 210 and the like).

Moreover, multiple reflectance minima exist for a given underlayer and ARC. These minima are periodic. After the first minimum, which occurs at the minimal acceptable thickness (that of a capping layer), these minima occur approximately every 800 Å. Thus, reflectance minima occur for a capping layer/hardmask over tungsten silicide at about 100 Å, 900 Å, 1700 Å and so on. A hardmask may therefore be deposited to any of the acceptable thicknesses at which there is a reflectance minimum. The thickness chosen will depend upon restrictions such as the amount of protection required and the amount of time permitted for the hardmask's deposition. These and other measurements are described in more detail in the section on experimental results.

Aside from reducing footing, a hardmask can also improve patterning accuracy. If a photoresist layer's etch selectivity is low, the etching operation may remove not only the exposed areas of the underlying layer, but portions of the photoresist layer as well. This may allow previously unexposed portions of the underlying layer to be etched. It is therefore preferable for a photoresist layer to exhibit high etch selectivity because of the increased patterning accuracy that high etch selectivity provides. High etch selectivity is exhibited, for example, by photoresist layer 220 in FIG. 3A. Photoresist layer 220, as illustrated in FIG. 3A, is not appreciably eroded during the etching of underlying layer 230, and so continues to protect unexposed areas of underlying layer 230 from the etchant. Although some photoresist material is normally removed during etching, extremely low etch selectivity, such as that exhibited by photoresist layer 225 in FIG. 3B, may allow photoresist layer 225 to etch through (or back, away from the exposed areas of the underlying layer) to the point that portions of underlying layer 230, which should have been protected, are also etched. Such unwanted etching may cause undesirable variations in surface topology and device characteristics, and may even render devices thus fabricated inoperable.

Hardmask 250 can significantly reduce such unwanted etching. Hardmask 250 better protects underlying layer 230 from the effects of etchants in areas where photoresist layer 220 has been over-etched in at least two ways. First, hardmask 250 acts as a buffer layer by covering underlying layer 230 with an additional thickness of protective material. Second, depending on its etch selectivity with regard to the etchant employed, hardmask 250 may actually etch more slowly than photoresist layer 220. ARC 210, however, is often unsuitable for providing such protection because of the need to reoptimize its optical parameters to account for changes in thickness or composition and, in some cases, its low etch selectivity.

FIG. 3B illustrates the effects of the low etch selectivity of photoresist 225 and the extra protection afforded by hardmask 250. As shown in FIG. 3B, photoresist layer 225 exhibits extremely low etch selectivity with respect to underlying layer 230 and thus experiences over-etching. For example, photoresist layer 225 is etched back from gap 245. However, the use of hardmask 250 avoids over-etching of underlying layer 230. Instead of underlying layer 230 being etched back to the point of an over-etch profile 280 (shown in phantom lines in FIG. 3B), hardmask 250 prevents exposure of these areas, thereby helping to maintain a desired profile 285.

Additionally, photoresist layer 225 may suffer etch-through in various places, which is illustrated in FIG. 3B by an etch-through 260. Hardmask 250 also protects underlying layer 230 in these areas. Due to the etch selectivity of hardmask 250 and the attendant increase in the overall thickness of the layer of material protecting underlying layer 230, the profile of underlying layer 230 is left intact. Only a small amount of hardmask 250 is etched away during the etching operation. This suggests that patterning operations employing a hardmask of the present invention will yield a more accurately patterned finished layer (i.e, underlying layer 230 after patterning) and a more even surface topology.

Figure 4:
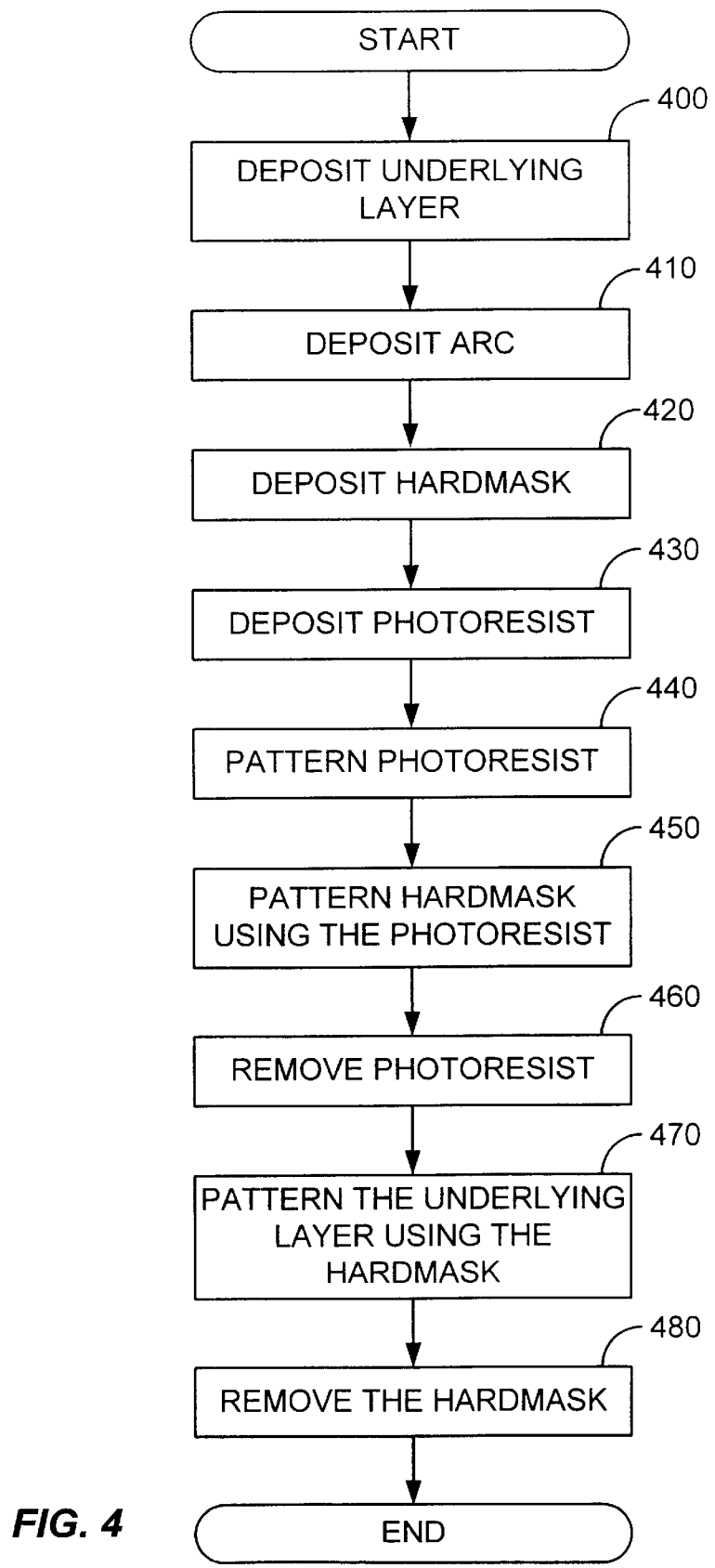
FIG. 4 is a flow diagram illustrating the processing steps performed in patterning an underlying layer using a capping layer/hardmask deposited according to the present invention.

Hardmask 250 may also be used as a mask layer in the patterning of underlying layer 230 by first patterning hardmask 250 and then using hardmask 250 to pattern underlying layer 230. FIG. 4 illustrates the steps performed in carrying out such a process, and is described with reference to the elements shown in FIG. 3B. First, underlying layer 230 is deposited at step 400 using an appropriate deposition method. Next, ARC 210 is deposited over underlying layer 230 to improve accuracy in the patterning of photoresist layer 225 (step 410). At step 420, hardmask 250 is deposited in a thickness appropriate to its use with ARC 210 and underlying layer 230. This is followed by the application of photoresist material to form photoresist layer 225 (step 430).

Next, photoresist layer 225 is developed (step 440), and the pattern created in photoresist layer 225 is transferred to hardmask 250 by an etching operation (step 450). The remaining portion of photoresist layer 225 may then be removed (step 460), if removal is desirable at this point. Next, underlying layer 230 is patterned using hardmask 250 (step 470), after which hardmask 250 and ARC 210 are removed (step 480). This avoids the problem of the photoresist etching away prior to the completion of etching the underlying layer. In this manner, the mask's pattern is accurately transferred onto the layer being patterned.

Alternatively, according to a more traditional technique, photoresist layer 225 may be left in place during the patterning of underlying layer 230, and subsequently removed along with hardmask 250 and ARC 210. The point in this process at which the remaining portion of photoresist layer 225 is removed depends on the etch chemistry and integration scheme employed. An integration scheme includes factors such as the type of equipment used, the level of device integration, the types of devices being created and other such factors. A significant factor is possible contamination from the photoresist's removal, which may be more acceptable during the removal of the remaining portions of the other layers.

IV. Deposition of a Capping Layer or Hardmask

The deposition of a capping layer or hardmask requires a process capable of depositing a low nitrogen content film at a low deposition rate, thereby allowing for the accurate control of film thickness. For example, a process capable of depositing a silicon oxide layer at a rate of between about 500 Å/minute and 1500 Å/minute is preferable. Because a capping layer differs from a hardmask only in thickness, the process parameters used in their creation will be similar. The exception is deposition time, which is increased to deposit the thicker hardmask.

Figure 5:
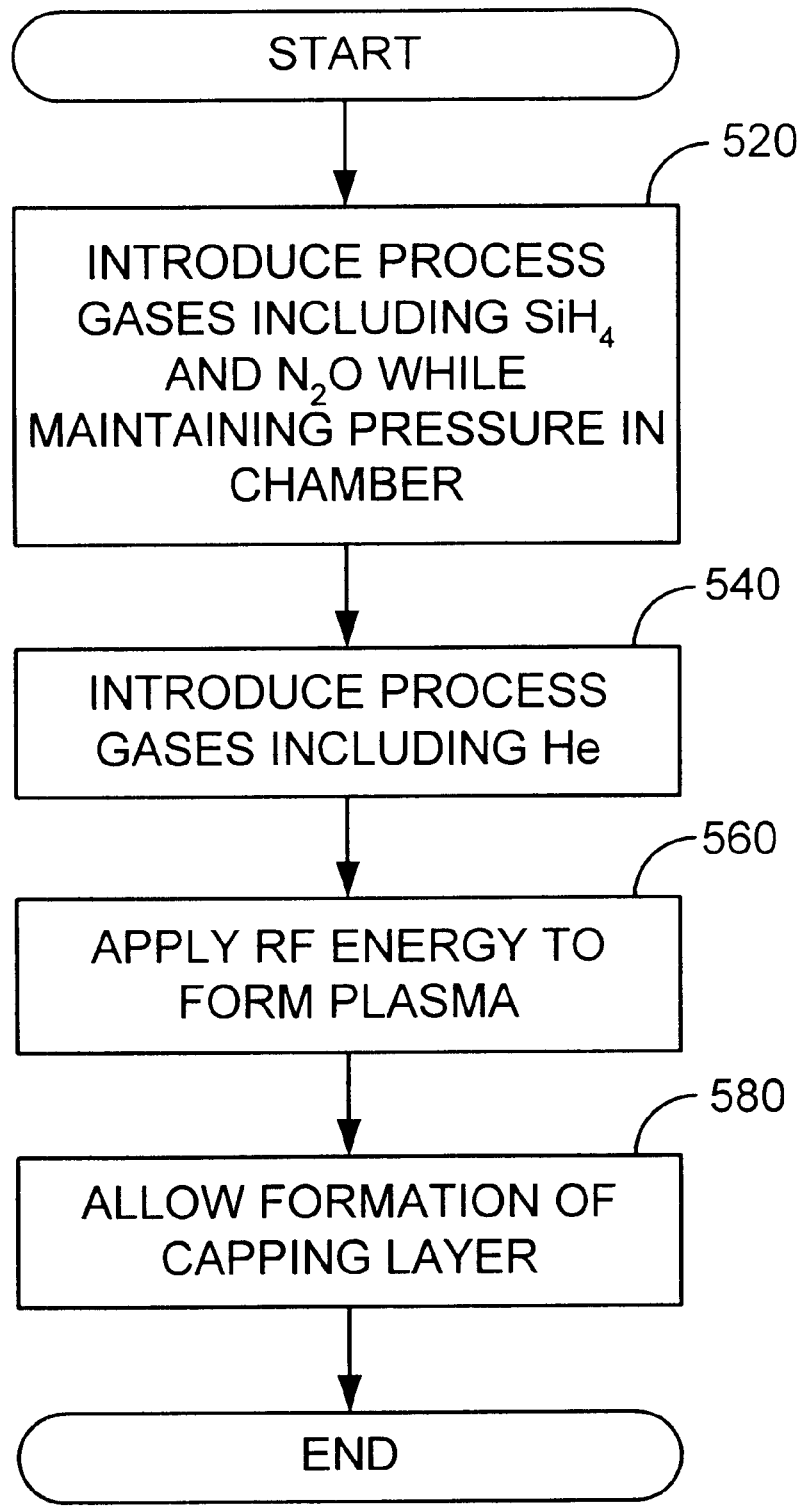
FIG. 5 is a flow diagram for a process of depositing a capping layer according to the method of the present invention.

FIG. 5 illustrates one embodiment of such a method, which deposits a capping layer or hardmask according to the method of the present invention. This process is described in terms of the exemplary PECVD system shown in FIG. 2A. The process is capable of depositing, for example, a silicon oxide capping layer over the upper surface of a substrate positioned in processing chamber 15. Pressure in processing chamber 15 is maintained at about b 5.5torr as process gases are introduced at step 520. These process gases preferably include silane ($SiH_4$) and nitrous oxide ($N_2O$). Nitrous oxide is an acceptable process gas because little or none of the nitrogen therein is incorporated into the resulting film. However, other processes for depositing a silicon oxide film may be used, as long as the process selected provides the necessary control of thickness. Examples of acceptable processes includes a PECVD process using TEOS and oxygen ($O_2$), a thermal CVD process using TEOS and ozone ($O_3$), and growing a silicon oxide layer. Of primary importance is the film's rate of formation, which should allow for the necessary control over the film's thickness and uniformity.

Silane is introduced into processing chamber 15 preferably at a rate between about 5 sccm and 50 sccm. Nitrous oxide is introduced into processing chamber 15 preferably at a rate between about 10 sccm and 1000 sccm. Next, helium is introduced into processing chamber 15 at step 540. The preferred flow rate for helium is between about 500 sccm and 5000 sccm and is most preferably about 1900 sccm. The preceding silane flow rate ranges identified as preferable represent a mixture containing between about 0.1% and 10% silane, by volume. The preceding helium flow rate ranges identified as preferable represent a mixture containing between about 50% and 90% helium, by volume. These ratios allows the deposition of $SiO_X$ to proceed at a rate that permits the accurate control of film thickness necessary in depositing a capping layer or hardmask. Because it is possible to substantially reduce footing using such a silicon oxide layer, a capping layer or hardmask of a different material should normally contain no more nitrogen than such a layer. However, a different level of nitrogen content may be acceptable as a maximum if the resulting degree of footing (i.e., inaccuracy) is acceptable.

RF power supply 25 supplies RF energy to form a controlled plasma adjacent to the substrate at step 560. RF power supply 25 preferably supplies RF power between about 50 W and 500 W to manifold 11, preferably at a frequency of about 13.56 MHz. The substrate temperature is in the range of 300–400° C. At step 580, a capping layer (or hardmask) is de posited by maintaining the preceding conditions.

The process parameters and gas introduction rates described herein are representative values for a lamp-heated DCVD Silane Chamber manufactured by Applied Materials, Inc., outfitted to process 8-inch substrate s. However, the process described above is not intended to limit the method of the present invention. For example, a resistively-heated DCVD DxZ Chamber manufactured by Applied Materials, Inc., outfitted to process 8-inch substrates may also be used to deposit a structure according to the method of the present invention using process parameters and gas introduction rates similar to those described herein. Moreover, other chamber sizes or chambers, including those made by other manufacturers, may be employed, although such systems may utilize different process values. As previously noted, other gases may be used to deposit a film of the type described herein.

V. Experimental Results

A structure according to the present invention, such as that illustrated in FIG. 3B, was simulated to determine the preferred characteristics of a capping layer (or hardmask). The process parameters previously indicated were found to result in the most preferable characteristics. The simulation was performed using a Prolitho simulator with Positive/Negative Resist Optical Lithography Model version 4.05a. The Prolitho simulator was configured with a deep UV radiant energy source having a wavelength of 248 nm. An exposure energy of 26 mJ was simulated using a development time of 80 seconds. The simulation used a simulated photoresist approximating the characteristics of APEX E photoresist. A substrate of tungsten (W) and silicon (Si), in the form of tungsten silicide (WSi$_x$), was used as the substrate upon which the subsequent layers were formed. At 248 mn, the simulated tungsten silicide substrate exhibited a refractive index (n) of 1.93 and absorptive index (k) of 2.73. A polysilicon substrate was also simulated.

A silicon oxynitride (SiO$_x$N$_y$) ARC (or DARC) was used in these simulations because the use of such an ARC is preferred in the present invention. The simulated DARC was tuned for deep UV, and exhibited a refractive index of 2.15 and absorptive index of 0.53, again at a wavelength of 248 nm. The DARC's thickness was selected by simulating various DARC thicknesses between 50 Å and 1000 Å. This was done for a DARC layer applied over both tungsten silicide and polysilicon. As expected, the minimum reflectivity at the photoresist/DARC interface occurred at a DARC thickness of about 300 Å.

Figure 6:
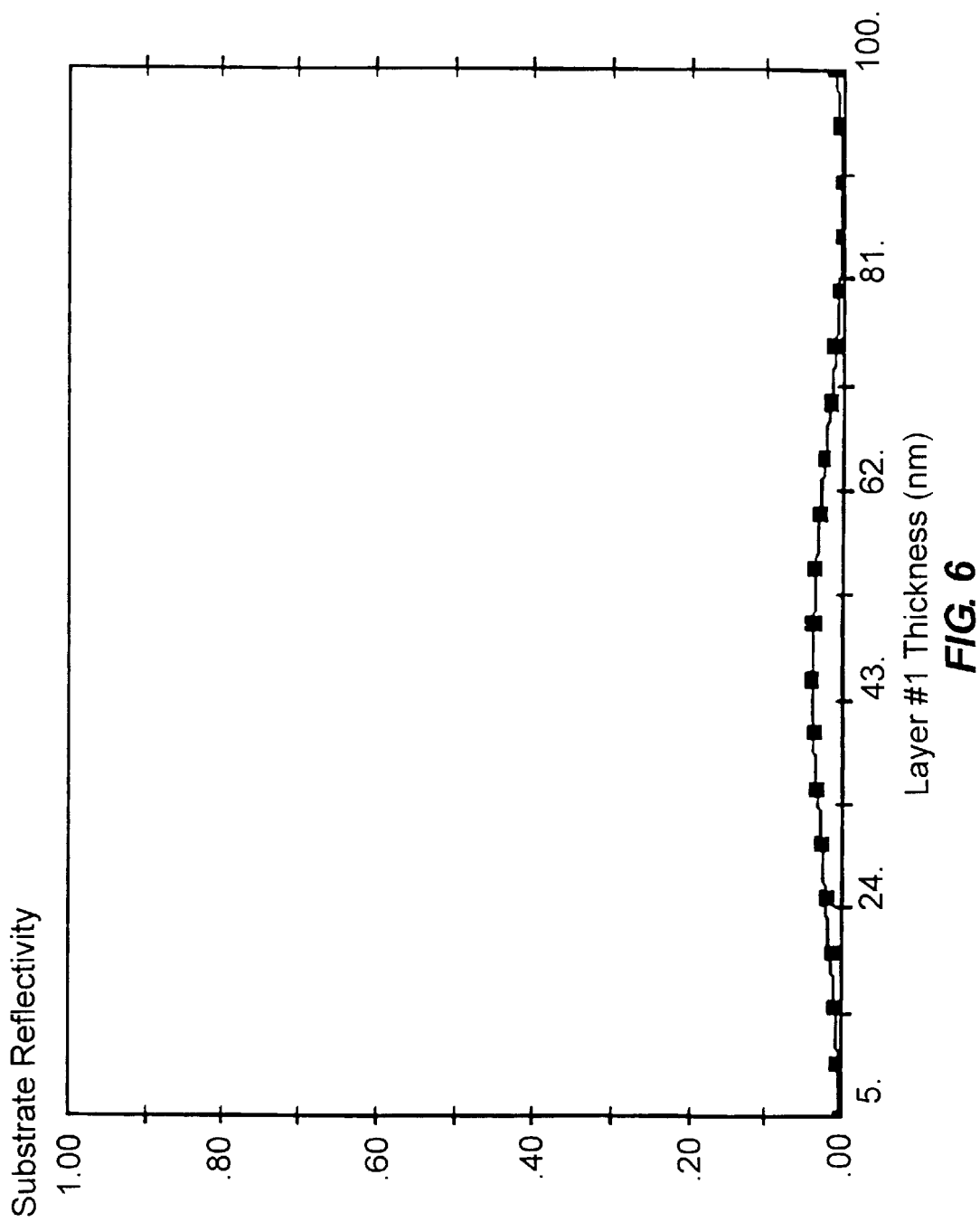
FIG. 6 is a graph of reflectivity versus capping layer/hardmask thickness for a simulated dielectric ARC (DARC) structure deposited over a tungsten silicide substrate according to the present invention.
Figure 7:
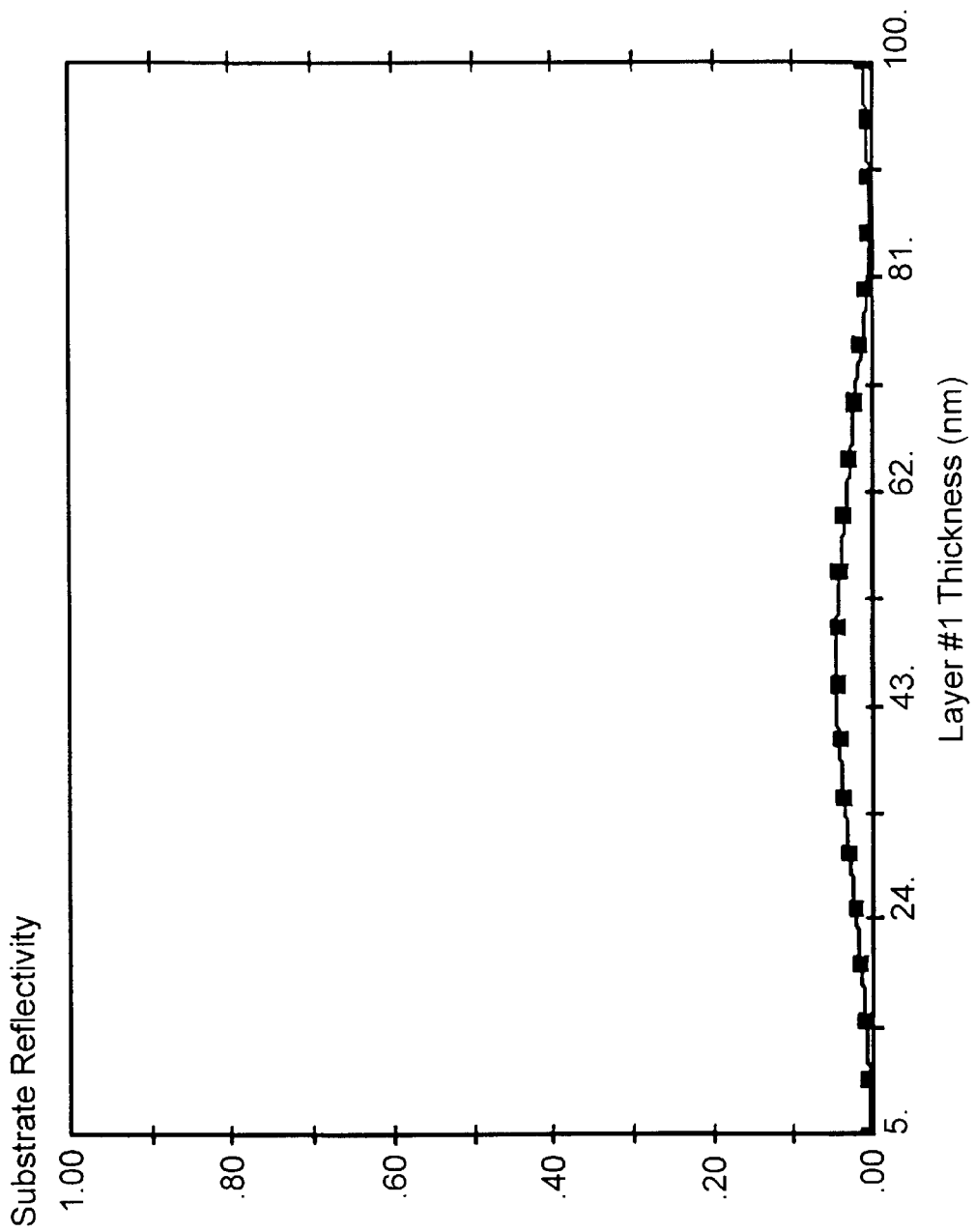
FIG. 7 is a graph of reflectivity versus capping layer/hardmask thickness for a simulated DARC structure deposited over a polysilicon substrate according to the present invention.

The results of these simulations are shown in FIGS. 6, 7, 8 and 9. FIGS. 6 and 7 indicate reflectivity versus capping layer/hardmask thickness. Lower reflectivity is desirable because reflected light can cause problems such as standing waves and unintended photoresist exposure, as previously discussed. FIG. 6 shows this relationship for a structure having a capping layer/hardmask and DARC deposited over a tungsten silicide substrate. FIG. 7 shows this relationship for a similar structure deposited over a polysilicon substrate. In both simulations, the capping layer's (hardmask's) thickness was varied from 50 Å to 1000 Å, while holding the DARC thickness constant at 300 Å.

As shown in FIGS. 6 and 7, a capping layer approximately 100 Å in thickness does not substantially adversely affect the reflectivity of the ARC/substrate interface, when deposited over either tungsten silicide or polysilicon substrates (FIGS. 6 and 7, respectively). Such a capping layer is also capable of reducing footing, but is too thin to provide the other advantages previously mentioned regarding low etch selectivity. Additionally, no appreciable increase in reflectivity was exhibited at a thickness of about 900 Å. This suggests that a 900 Å-thick hardmask may be used as a masking layer during etching without affecting DARC lithography performance. At about 900 Å in thickness, a hardmask is capable of providing the previously mentioned advantages regarding problems caused by photoresist with low etch selectivity.

Figure 8:
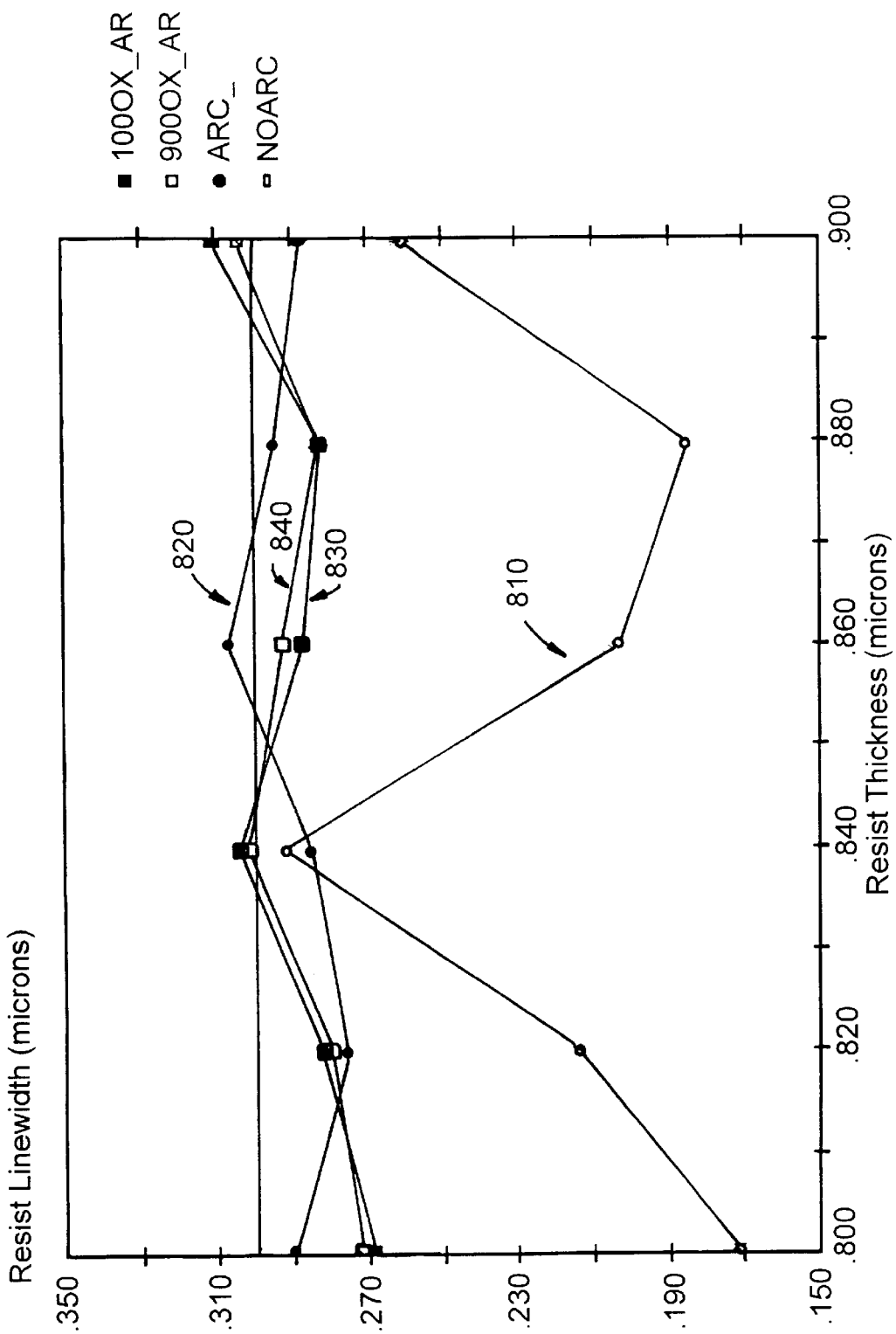
FIG. 8 is a graph of photoresist line width versus photoresist layer thickness for a simulated DARC structure according to the present invention.

FIG. 8 is a graph of photoresist line width versus photoresist layer thickness. Line width is, as the term suggests, the width of a strip of material deposited on a substrate. In the simulation, photoresist layer thickness was varied from 800 nm to 900 nm. The simulator then computed the resulting photoresist line width, using an ideal line width of 0.3 μm. Photoresist line widths varied dramatically when only a photoresist layer was used. Without an ARC or capping layer, photoresist line width varied between about 0.17 μm and 0.29 μm, and averaged about 0.216 μm, as trace 810 in FIG. 8 illustrates.

The addition of an ARC visibly improves consistency in line widths over variations in the photoresist layer's thickness. As illustrated by trace 820, photoresist line width only varied between about 0.275 μm and 0.310 μm, averaging about 0.289 μm, when a DARC was used. The addition of a hardmask further reduces variations in line width associated with changes in photoresist layer thickness. A 100 Å capping layer (shown as trace 830) varied only between about 0.270 μm and 0.310 μm, averaging about 0.292 μm. A 900 Å capping layer (i.e., hardmask; shown as trace 840) actually improves line width accuracy even more than a 100 Å capping layer, varying only between about 0.273 μm and 0.305 μm, and averaging about 0.295 μm. Thus, the combination of a capping layer (or hardmask) and DARC may be expected to improve the accuracy of pattern transfer between a mask and a photoresist layer.

Figure 9:
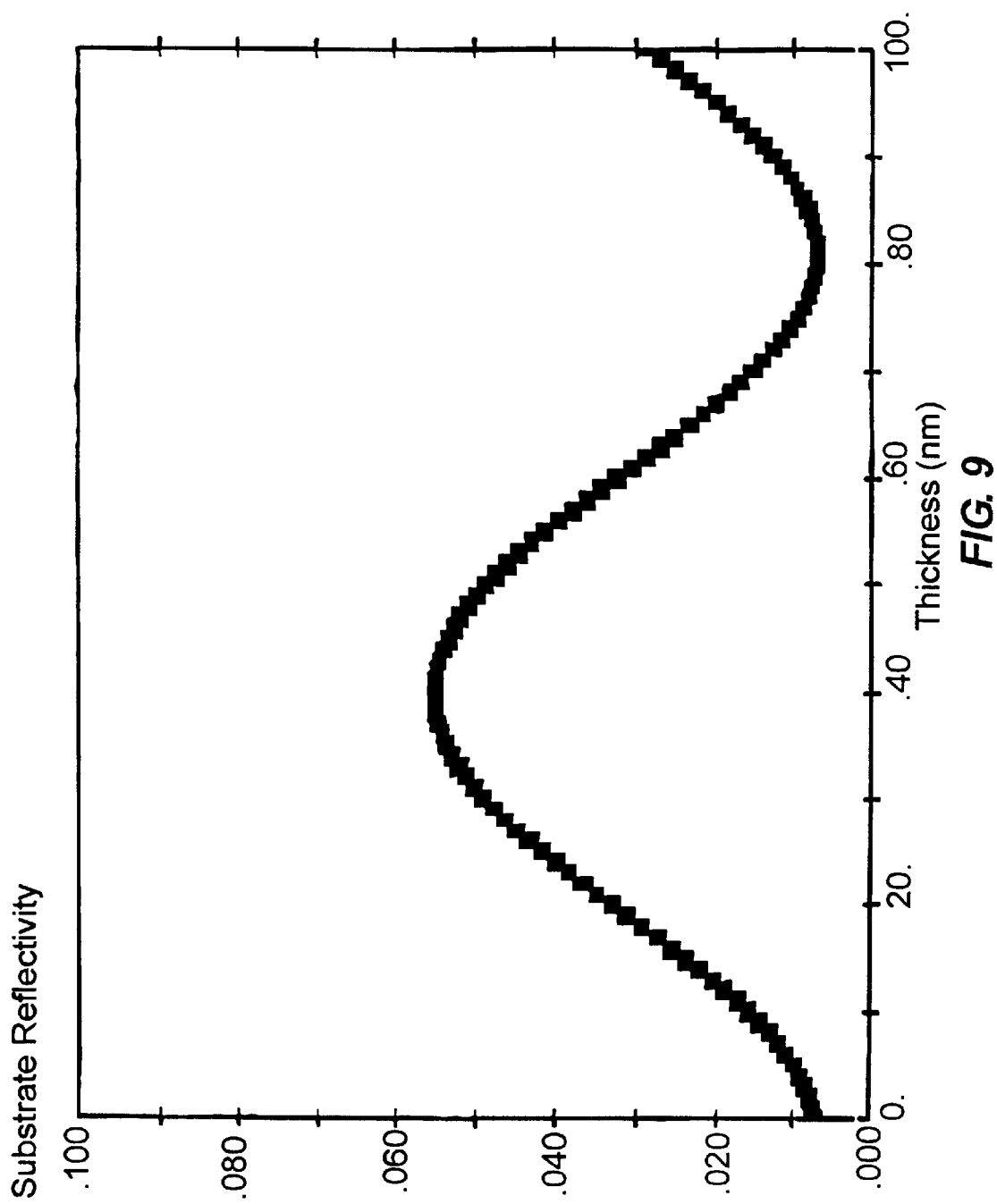
FIG. 9 is a graph of reflectivity versus capping layer/hardmask thickness for a simulated DARC combination deposited over an aluminum layer.

FIG. 9 shows a graph indicating reflectivity versus hardmask thickness for a hardmask/DARC combination deposited over aluminum. Hardmask thickness was again varied from 0 Å to 1000 Å, while holding the DARC thickness constant at 270 Å. No appreciable increase in reflectivity was exhibited at a hardmask thickness of about 850 Å. This suggests that a hardmask, 850 Å in thickness, may be used as a masking layer during the etching of an aluminum layer without adversely affecting DARC lithography performance. The minimum in reflectance visible at the low end of the thickness range reflects a thickness of a capping layer for an aluminum substrate of about 50 Å. The minimal value below that simply indicates that not applying a hardmask causes no increase in reflectivity. As previously noted, reflectance minimums occur with a period of about 800 Å. This periodicity is evident in the traces of reflectivity versus capping layer/hardmask thickness in FIGS. 6, 7 and 9.

Figure 10A:
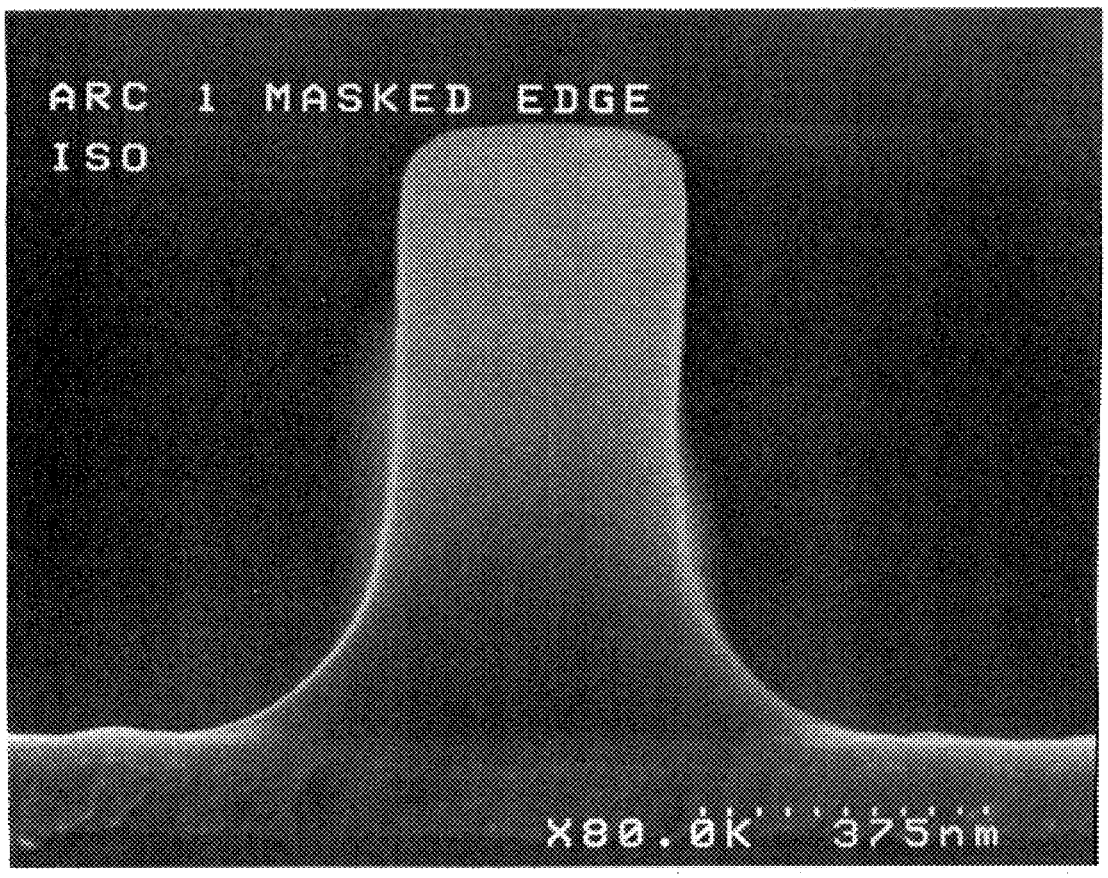
FIG. 10A is a scanning electron microscope (SEM) photograph of a strip of photoresist developed on an ARC without a capping layer according to the present invention.
Figure 10B:
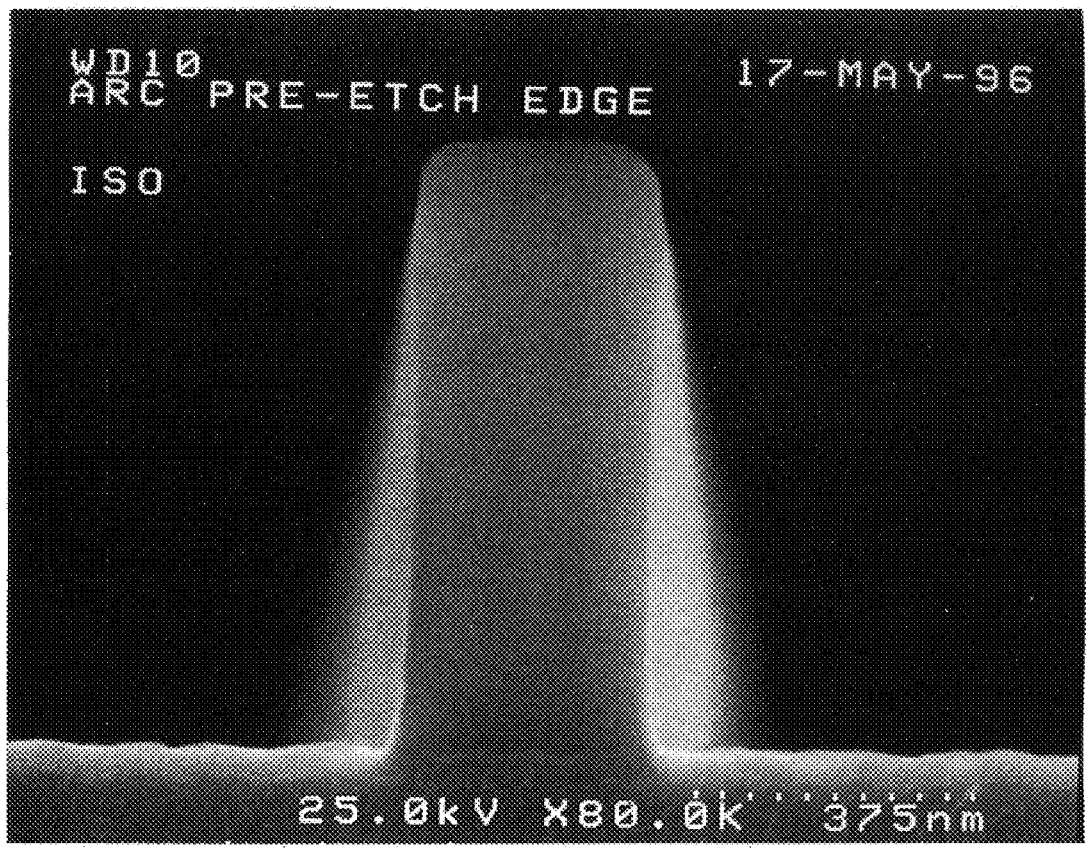
FIG. 10B is an SEM photograph of a strip of photoresist developed on an ARC having a capping layer according to the present invention deposited between the photoresist layer and the ARC.

The physical effects of a capping layer are evident in FIGS. 10A and 10B. FIG. 10A shows a scanning electron microscope (SEM) photograph of a photoresist strip without a capping layer. A large amount of footing is evident at the strip's bottom edges. It is this footing that leads to unwanted variations in line width in the resulting (patterned) layer. In FIG. 10B, shows an SEM photograph of a photoresist strip over a structure employing a capping layer. As noted earlier, footing is visibly reduced by the inclusion of a capping layer into the photolithographic process.

The method of the present invention is not intended to be limited by the specific parameters set forth in the above experiments. A person of ordinary skill in the art will realize that different processing conditions and different reactant sources can be used without departing from the spirit of the invention. Other equivalent or alternative methods of depositing a hardmask according to the present invention will be apparent to those skilled in the art. For example, although helium is used in a preferred embodiment, other inert gases may also be employed, as may other sources of silicon and oxygen. Also, the thicknesses indicated herein are only exemplary, and film properties (e.g., thickness) may vary without substantially adversely affecting the photolithographic process. Different materials will mandate different capping layer/hardmask thicknesses. These equivalents and alternatives are intended to be included within the scope of the present invention.

What is claimed is:

1. A method for reducing footing in a photoresist layer deposited on a substrate, comprising the steps of:
   depositing an antireflective layer comprising silicon, oxygen and nitrogen on the substrate; and
   depositing a capping layer on said antireflective layer, said capping layer
   having a nitrogen content less than a nitrogen content of said antireflective layer.

2. The method of claim 1 wherein said nitrogen content of said capping layer is less than about 5%, by weight.

3. The method of claim 2, wherein said capping layer is deposited to a thickness selected such that said capping layer does not increase a reflectivity of said antireflective layer by more than about 25%.

4. The method of claim 3 wherein said capping layer comprises silicon and oxygen.

5. The method of claim 1 further comprising the step of depositing the photoresist layer.

6. A method for reducing footing in a photoresist layer deposited on a substrate, comprising the steps of depositing an antireflective layer comprising silicon, oxygen and nitrogen on the substrate; and depositing a capping layer to a thickness of between about 50 Å and 150 Å on said antireflective layer, said capping layer having a nitrogen content of less than about 5% by weight, which is less than nitrogen content of said antireflective layer.

7. A method for reducing footing in a photoresist layer deposited on a substrate, comprising the steps of depositing an antireflective layer comprising silicon, oxygen and nitrogen on the substrate; and depositing capping layer to a thickness of between about 50 Å and 150 Å plus a whole multiple of about 800 Å on said antireflective layer, said capping layer having a nitrogen content of less than about 5%, by weight which is less than a nitrogen content of said antireflective layer.

8. A method for reducing footing in a photoresist layer deposited on a substrate, comprising the steps of depositing an antireflective layer comprising silicon, oxygen and nitrogen on the substrate; and depositing a capping layer to a thickness of between about 700 Å and 1100 Å on said antireflective layer, said capping layer having a nitrogen content of less than about 5% by weight, which is less than a nitrogen content of said antireflective layer.

9. The method of claim 8 wherein said capping layer is deposited to about 900 Å in thickness and said antireflective layer is deposited on a tungsten silicide layer.

10. The method of claim 8 wherein said capping layer is deposited to about 900 Å in thickness and said antireflective layer is deposited on a polysilicon layer.

11. The method of claim 8 wherein said capping layer is deposited to about 850 Å in thickness and said antireflective layer is deposited on an aluminum layer.

12. A process for patterning a layer formed on a substrate, said process comprising the steps of:
   depositing an antireflective layer on the layer;
   depositing a capping layer to a thickness of between about 50 Å and 150 Å on said antireflective layer said capping layer having a nitrogen content of less than about 5%, by weight;
   depositing a photoresist layer on said capping layer;
   removing a first portion of said photoresist layer a first portion of said capping layer and a first portion of said antireflective layer according to a mask pattern in order to expose a first portion of the layer substantially similar in shape to said first portions of said photoresist layer, said capping layer and said antireflective; and
   removing the first portion of the layer, leaving a remaining portion of the layer substantially similar to shape to said remaining portion of said photoresist layer, said capping layer and said antireflective layer.

13. A process for patterning a layer formed on a substrate, and process comprising the steps of:
   depositing an antireflective layer on the layer;
   depositing a capping layer to a thickness of between about 700 Å and 1100 Å to form a hardmask layer on said antireflective layer, said capping layer having a nitrogen content of less than about 5% by weight;
   depositing a photoresist layer on said capping layer;
   removing a first portion of said photoresist layer, a first portion of said capping layer and a first portion of said antireflective layer according to a mask pattern in order to expose a first portion of the layer substantially similar in shape to said first portion of said photoresist layer, said capping layer and said antireflective layer; and
   removing the first portion of the layer, leaving a remaining portion of the layer substantially similar in shape to said remaining portion of said photoresist layer, and capping layer and said antireflective layer.

14. A process for patterning a layer formed on a substrate, said process comprising the steps of:
   depositing an antireflective layer on the layer;
   depositing a capping layer to a thickness of between about 50 Å and 150 Å plus a whole multiple of about 800 Å on said antireflective layer, and capping layer having a nitrogen content of less than about 5% by weight;
   deposing a photoresist layer on said capping layer;
   removing a first portion of said photoresist layer, a first portion of said capping layer and a first portion of said antireflective layer according to a mask pattern in order to expose a first portion of the layer substantially similar in shape to said first portions of said photoresist layer, and capping layer and said antireflective layer; and
   removing the first portion of the layer, leaving a remaining portion of the layer substantially similar in shape to said remaining portion of said photoresist layer, said capping layer and said antireflective layer.

15. A method for reducing footing in a photoresist layer deposited on a substrate, comprising the steps of:
   depositing an antireflective layer comprising silicon, oxygen and nitrogen on the substrate;
   depositing a capping layer on said antireflective layer, said capping layer having a nitrogen content less than about 5%, by weight and deposited to a thickness selected such that said capping layer does not increase a reflectivity of said antireflective layer by more than about 25%; and
   depositing the photoresist layer.

* * * * *